United States Patent
Cho et al.

(10) Patent No.: US 11,421,151 B2
(45) Date of Patent: Aug. 23, 2022

(54) LIGHT EMITTING DEVICE AND DISPLAY DEVICE INCLUDING QUANTUM DOT

(71) Applicant: SAMSUNG ELECTRONICS CO., LTD., Suwon-si (KR)

(72) Inventors: Oul Cho, Suwon-si (KR); Jooyeon Ahn, Suwon-si (KR); Eun Joo Jang, Suwon-si (KR); Dae Young Chung, Suwon-si (KR); Hyun A Kang, Suwon-si (KR); Tae Hyung Kim, Seoul (KR); Yun Sung Woo, Yongin-si (KR); Jeong Hee Lee, Seongnam-si (KR); Shin Ae Jun, Seongnam-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 218 days.

(21) Appl. No.: 15/821,007

(22) Filed: Nov. 22, 2017

(65) Prior Publication Data
US 2018/0151817 A1 May 31, 2018

(30) Foreign Application Priority Data
Nov. 25, 2016 (KR) .................. 10-2016-0158704
Dec. 20, 2016 (KR) .................. 10-2016-0174971

(51) Int. Cl.
*C09K 11/02* (2006.01)
*H01L 51/50* (2006.01)
(Continued)

(52) U.S. Cl.
CPC ............ *C09K 11/025* (2013.01); *C09K 11/06* (2013.01); *C09K 11/703* (2013.01);
(Continued)

(58) Field of Classification Search
CPC ...... H05B 33/14; C09K 11/06; C09K 11/883; C09K 11/703; H01L 51/502;
(Continued)

(56) References Cited

U.S. PATENT DOCUMENTS 7,476,487 B2   1/2009   Park et al.
7,746,423 B2   6/2010   Im et al.
(Continued)

FOREIGN PATENT DOCUMENTS

CN   103113882 A   5/2013
CN   105185918 A   12/2015
(Continued)

OTHER PUBLICATIONS

Adis Khetubol, et al., "Triplet Harvesting in Poly(9-vinylcarbazole) and Poly(9-(2,3-epoxypropyl)carbazole) Doped with CdSe/ZnS Quantum Dots Encapsulated with 16-(N-Carbazolyl) Hexadecanoic Acid Ligands", Journal of Polymer Science, Part B: Polymer Phrsics 2014, 52, 539-551.
(Continued)

*Primary Examiner* — Andrew K Bohaty
*Assistant Examiner* — Jenna N Chandhok
(74) *Attorney, Agent, or Firm* — Cantor Colburn LLP

(57) ABSTRACT

A light emitting device including a semiconductor nanocrystal and a ligand bound to a surface of the semiconductor nanocrystal, wherein the ligand includes an organic thiol ligand or a salt thereof and a polyvalent metal compound including a metal including Zn, In, Ga, Mg, Ca, Sc, Sn, Ti, V, Cr, Mn, Fe, Co, Ni, Cu, Sr, Y, Zr, Nb, Mo, Cd, Ba, Au, Hg, Tl, or a combination thereof, and a display device including the light emitting device.

20 Claims, 19 Drawing Sheets

(51) Int. Cl.

| | |
|---|---|
| *H05B 33/14* | (2006.01) |
| *C09K 11/70* | (2006.01) |
| *C09K 11/88* | (2006.01) |
| *F21V 8/00* | (2006.01) |
| *C09K 11/06* | (2006.01) |
| *H01L 51/00* | (2006.01) |
| *B82Y 20/00* | (2011.01) |
| *B82Y 40/00* | (2011.01) |

(52) U.S. Cl.
CPC ............ *C09K 11/883* (2013.01); *G02B 6/005* (2013.01); *H01L 51/0035* (2013.01); *H01L 51/0037* (2013.01); *H01L 51/0039* (2013.01); *H01L 51/0092* (2013.01); *H01L 51/502* (2013.01); *H05B 33/14* (2013.01); *B82Y 20/00* (2013.01); *B82Y 40/00* (2013.01); *C09K 2211/188* (2013.01); *C09K 2323/03* (2020.08); *C09K 2323/031* (2020.08); *H01L 51/5012* (2013.01); *H01L 51/5056* (2013.01); *H01L 51/5088* (2013.01); *Y10S 977/774* (2013.01); *Y10S 977/783* (2013.01); *Y10S 977/818* (2013.01); *Y10S 977/824* (2013.01); *Y10S 977/892* (2013.01); *Y10S 977/896* (2013.01); *Y10S 977/95* (2013.01)

(58) Field of Classification Search
CPC ........... H01L 2251/301; H01L 51/0092; Y10S 977/824; Y10S 977/818; B82Y 20/00
See application file for complete search history.

(56) References Cited

U.S. PATENT DOCUMENTS

| | | | | |
|---|---|---|---|---|
| 8,895,319 | B2 | 11/2014 | Koo et al. | |
| 9,196,682 | B2 | 11/2015 | Jang et al. | |
| 9,212,056 | B2 | 12/2015 | Breen et al. | |
| 2011/0017951 | A1* | 1/2011 | Ryowa | C09K 11/62 252/301.16 |
| 2011/0084250 | A1* | 4/2011 | Jang | B82Y 10/00 257/14 |
| 2013/0099213 | A1 | 4/2013 | Jun et al. | |
| 2014/0151612 | A1 | 6/2014 | Cho et al. | |
| 2014/0353579 | A1* | 12/2014 | Greco | H01L 21/02477 257/13 |
| 2015/0021551 | A1* | 1/2015 | Breen | H01L 33/28 257/14 |
| 2015/0098212 | A1 | 4/2015 | Won et al. | |
| 2016/0005932 | A1 | 1/2016 | Lee et al. | |
| 2016/0011506 | A1 | 1/2016 | Gu et al. | |
| 2017/0082892 | A1 | 3/2017 | Chung | |
| 2017/0176816 | A1 | 6/2017 | Han et al. | |
| 2017/0247613 | A1* | 8/2017 | Ono | C09K 11/703 |
| 2017/0342316 | A1* | 11/2017 | Luther | H01L 33/44 |
| 2018/0148638 | A1 | 5/2018 | Ahn et al. | |

FOREIGN PATENT DOCUMENTS

| | | |
|---|---|---|
| CN | 105985774 A | 10/2016 |
| EP | 3070756 A1 | 9/2016 |
| EP | 3187564 A1 | 7/2017 |
| JP | 2014093327 A | 5/2014 |
| KR | 1020120028670 A | 3/2012 |
| KR | 1020120050145 A | 5/2012 |
| KR | 101212656 B1 | 12/2012 |
| KR | 1020130044071 A | 5/2013 |
| KR | 1020130114436 A | 10/2013 |
| KR | 1020150072089 A | 6/2015 |
| KR | 1020170034055 A | 3/2017 |
| KR | 1020170072418 A | 6/2017 |
| WO | 0017656 A1 | 3/2000 |
| WO | 2015002565 A1 | 1/2015 |
| WO | 2016080435 A1 | 5/2016 |

OTHER PUBLICATIONS

Bing Bai, et al., "Quaternary CU2ZnSnS4 quantum dot-sensitized solar cells: Synthesis, passivation and ligand exchange". Journal of Power Sources 318 (2016) 35-40.

Cherie R. Kagan, et al., "Charge transport in strongly coupled quantum dot solids", Nature Nanotechnology 2015, 10, 1013-1026.

Chih-Hung Chen, et al., "Thiol treatment to enhance photoluminescence and electroluminescence of CdSe/CdS core-shell quantum dots prepared by thermal cycling of single source precursors", RSC Adv. 2015, 5, 9819.

Evren Mutlugun, et al., "Colloidal Quantum Dot Light-Emitting Diodes Employing Phosphorescent Small Organic Moleculed as Efficient Exciton Harvesters", J. Phys. Chem. Lett 2014, 5, 2802-2807.

Marcus L. Bohm, et al., "Size and Energy Level Tuning of Quantum Dot Solids ia a Hybrid Ligand Complex", J Phys. Chem. Lett. 2015, 6, 3510-3514.

Mausam Kalita, et al., "Direct Synthesis of Aqueous Quantum Dots through 4,4'-Bipyridine-Based Twin Ligand Strategy", Inorg. Chem. 2012, 51, 4521-4526.

Wenjie Li, et al., "Capping Ligand-Induced Self-Assembly for Quantum Dot Sensitized Solar Cells", J. Phys. Chem. Lett 2015, 6, 796-806.

The Office Action dated Nov. 20, 2018, of U.S. Appl. No. 15/820,781.

Di Liu et al., "Water-Soluble Semiconductor Nanocrystals Cap Exchanged with Metalated Ligands," ACS NANO, DOI: 10.1021/nn1025934, Dec. 8, 2010, pp. 546-550, vol. 5, No. 1, 2011 Amenrical Chemical Society (www.acsnano.org).

Extended European Search Report dated Mar. 2, 2018, of the corresponding European Patent Application No. 17203145.2.

Extended European Search Report dated Mar. 5, 2018, of the corresponding European Patent Application No. 17203152.8.

Office Action dated Mar. 8, 2019, of the corresponding U.S. Appl. No. 15/820,781.

Office Action dated Mar. 3, 2021, of the corresponding Chinese Patent Application No. 201711176209.3.

Xingliang Dai et al., "Solution-processed, high-performance light-emitting diodes based on quantum dots," Nature, Oct. 29, 2014, pp. 96-99, vol. 515.

\* cited by examiner

LIGHT EMITTING DEVICE AND DISPLAY DEVICE INCLUDING QUANTUM DOT

CROSS-REFERENCE TO RELATED APPLICATION

This application claims priority to Korean Patent Application No. 10-2016-0158704 filed in the Korean Intellectual Property Office on November 25, and 10-2016-0174971, and Korean Patent Application No. filed in the Korean Intellectual Property Office on Dec. 20, 2016, and all the benefits accruing therefrom under 35 U.S.C. § 119, the contents of which are incorporated herein in their entireties by reference.

BACKGROUND

1. Field

A light emitting device and a display device including quantum dots are disclosed.

2. Description of the Related Art

Quantum dots (e.g., nano-sized semiconductor nanocrystals) may have different energy bandgaps by controlling their sizes and compositions. Such quantum dots may emit light of various wavelengths. In a colloidal synthesis, organic materials such as a dispersing agent or a solvent may coordinate, e.g., be bound, to a surface of a semiconductor nanocrystal during the growth thereof. As a result, quantum dots having a controlled size and showing desired luminous properties may be prepared.

The quantum dots may be used in various electronic devices including a display device and it is desirable to develop techniques for enhancing properties (e.g., a quantum yield) of the quantum dots in an electronic device (e.g., a light emitting device).

SUMMARY

An embodiment is related to a light emitting device including a quantum dot that may show an enhanced hole transporting property and an increased quantum efficiency by improving an electron-hole balance in a light emitting layer.

An embodiment provides a display device including the light emitting device.

In an embodiment, a light emitting device includes a first electrode and a second electrode facing each other, and a light emitting layer disposed between the first electrode and the second electrode and including a quantum dot (e.g., a plurality of quantum dots), wherein the quantum dot includes a semiconductor nanocrystal and a ligand bound to a surface of the semiconductor nanocrystal, and wherein the ligand includes an organic thiol ligand or a salt thereof and a polyvalent metal compound including a metal including Zn, In, Ga, Mg, Ca, Sc, Sn, Ti, V, Cr, Mn, Fe, Co, Ni, Cu, Sr, Y, Zr, Nb, Mo, Cd, Ba, Au, Hg, Tl, or a combination thereof.

The quantum dot may include a core including a first semiconductor nanocrystal and a shell disposed on the core and including a second semiconductor nanocrystal.

The first semiconductor nanocrystal and the second semiconductor nanocrystal may be the same or different, and may be independently a Group II-VI compound, a Group III-V compound, a Group IV-VI compound, a Group IV element or compound, a Group I-III-VI compound, a Group I-II-IV-VI compound, or a combination thereof.

The organic thiol ligand or a salt thereof may include a compound represented by Chemical Formula 1:

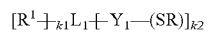

Chemical Formula 1 wherein, $R^1$ is hydrogen, a substituted or unsubstituted C1 to C40 (or C1 to C30) linear or branched alkyl group, a C1 to C40 (or C1 to C30) linear or branched alkenyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C3 to C30 cycloalkyl group, a substituted or unsubstituted C2 to C30 heterocycloalkyl group, a C1 to C10 alkoxy group, a hydroxy group, —$NH_2$, a substituted or unsubstituted C1 to C30 amine group (—NRR', wherein R and R' are the same or different, and are independently hydrogen or a C1 to C30 linear or branched alkyl group, and provided that R and R' are not hydrogen simultaneously), an isocyanate group, a halogen, —ROR' (wherein R is a substituted or unsubstituted C1 to C20 alkylene group and R' is hydrogen or a C1 to C20 linear or branched alkyl group), an acyl halide (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' (wherein R and R' are the same or different, and are independently hydrogen or a C1 to C20 linear or branched alkyl group), —C(=O)ONRR' (wherein R and R' are the same or different, and are independently hydrogen or a C1 to C20 linear or branched alkyl group) or a combination thereof, $L_1$ is a carbon atom, a nitrogen atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C2 to C30 heterocycloalkylene group, a substituted or unsubstituted C6 to C30 arylene group, a substituted or unsubstituted C3 to C30 heteroarylene group, or a substituted or unsubstituted C2 to C30 alkylene group or a substituted or unsubstituted C3 to C30 alkenylene group wherein at least one methylene (—$CH_2$—) is replaced with sulfonyl (—$S(=O)_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof, $Y_1$ is a single bond, —C(=S)—, a substituted or unsubstituted C1 to C30 alkylene group, a substituted or unsubstituted C2 to C30 alkenylene group, or a C2 to C30 alkylene group or a C3 to C30 alkenylene group wherein at least one methylene (—$CH_2$—) is replaced by sulfonyl (—$S(=O)_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, R is hydrogen or a monovalent metal (e.g., an alkali metal such as Li, Na, K, or the like);

k1 is 0 or an integer of 1 or more, k2 is 1 or 2 wherein when the k2 is 2, the $Y_1$ is a single bond and the two SR moieties are bonded to adjacent two carbon atoms in the $L_1$ moiety, respectively, and a sum of k1 and k2 does not exceed the valence of $L_1$.

The organic thiol ligand or a salt thereof may include a compound represented by Chemical Formula 1-1, Chemical Formula 1-2, or Chemical Formula 1-3:

$$R^a-L-(CRR)_n SM \qquad \text{Chemical Formula 2-1}$$

$$R^a\!-\!\!\left[CR_2\right]_n\!\!-\!\!\underset{R}{\overset{SM}{\underset{|}{\overset{|}{C}}}}\!-\!\underset{R}{\overset{SM}{\underset{|}{\overset{|}{C}}}}\!-\!R \qquad \text{Chemical Formula 2-2}$$

$$RRNCSSM \qquad \text{Chemical Formula 2-3}$$

wherein $R^a$ is a substituted or unsubstituted C1 to C24 alkyl group, a substituted or unsubstituted C2 to C24 alkenyl group, or a substituted or unsubstituted C6 to C20 aryl group, each R is the same or different, and is independently hydrogen or a substituted or unsubstituted C1 to C24 alkyl group, n is 0 or an integer of 1 to 15, L is a direct bond, a sulfonyl (—S(=O)$_2$—), carbonyl (—C(=O)—), ether group (—O—), sulfide group (—S—), sulfoxide group (—S(=O)—), ester group (—C(=O)O—), amide group (—C(=O)NR—) (wherein R is hydrogen or a C1 to C10 alkyl group), a substituted or unsubstituted C1 to C10 alkylene, a C2 to C10 alkenylene, or a combination thereof, and M is hydrogen, lithium, sodium, potassium, or a combination thereof.

The organic thiol ligand may or a salt thereof include a substituted or unsubstituted C1 to C40 alkyl thiol compound, a C2 to C40 mercapto carboxylic acid compound, a C2 to C40 mercapto carboxylic acid alkyl ester compound, a dithiocarbamate compound having a C1 to C40 alkyl group, or a combination thereof.

The organic thiol ligand or a salt thereof may include butanethiol, pentanethiol, hexanethiol, heptanethiol, octanethiol, nonanethiol, decanethiol, undecanethiol, dodecanethiol, octadecanethiol, 2-(2-methoxyethoxy)ethanethiol, 3-methoxybutyl 3-mercaptopropionate, 3-methoxybutyl mercaptoacetate, thioglycolic acid, 3-mercaptopropionic acid, thiopronine, 2-mercaptopropionic acid, 2-mercapto propionate, 2-mercaptoethanol, cysteamine, 1-thioglycerol, mercaptosuccinic acid, L-cysteine, dihydrolipoic acid, 2-(dimethylamino)ethanethiol, 5-mercaptomethyl tetrazole, 2,3-dimercapto-1-propanol glutathione, methoxy polyethylene glycol thiol (m(PEG)-SH), di(C1 to C30 alkyl)dithiocarbamic acid or a salt thereof, e.g., diethyldithiocarbamic acid or diethyldithiocarbamate, or a combination thereof.

The organic thiol ligand or a salt thereof may not include a carboxylic acid moiety.

The polyvalent metal compound may include an organic metal compound, an organic metal salt, an inorganic metal salt, or a combination thereof.

The polyvalent metal compound may include a metal halide, an alkylated metal, a metal carboxylate, a metal acrylate, a metal methacrylate, a metal dialkyldithiocarbamate, or a combination thereof.

The polyvalent metal compound may include zinc chloride, indium chloride, cadmium chloride, aluminum chloride, manganese chloride, diethyl zinc, dipropyl zinc, dibutyl zinc, triethyl aluminum, tributyl aluminum, a zinc (meth) acrylate compound, a zinc carboxylate compound (e.g., zinc acetate, zinc propionate, zinc butyrate, or the like), indium acetate, or a combination thereof.

The polyvalent metal compound may include a compound represented by Chemical Formula 2:

$$MA_n \qquad \text{Chemical Formula 2}$$

wherein M is Mg, Ca, Sc, Sn, Ti, V, Cr, Mn, Fe, Co, Ni, Cu, Zn, Ga, Sr, Y, Zr, Nb, Mo, Cd, In, Ba, Au, Hg, or Tl, n is determined depending on the valency of the M and is an integer of greater than or equal to 2, each A is the same or different, and is independently a C1-C10 organic group (e.g., hydrocarbyl group, an alkyl ester group, or the like), a halogen (such as F, Cl, Br or I), or a combination thereof.

In some embodiments, the A of Chemical Formula 2 may include a C1-C5 (or C2-C5) organic group, a halogen containing group, or a combination thereof.

The A of Chemical Formula 2 may include a C2 to C5 hydrocarbyl group, RCOO— or ROCO— (wherein R is a C1 to C4 hydrocarbyl group), a halogen (e.g., fluorine, chlorine, bromine, or iodine), or a combination thereof.

The polyvalent metal compound may include a metal that is the same as the metal present on a surface of the quantum dot. For example, when the outermost layer of the quantum dot includes zinc, the M of Chemical Formula 2 may be zinc.

The polyvalent metal compound may be present in an amount of about 10 percent by weight (wt %) to about 90 wt % based on the total amount of the organic thiol ligand or a salt thereof and the polyvalent metal compound.

The quantum dot may have a 5% weight loss temperature (that is, the temperature at which 5% of the weight of the quantum dot is lost) of less than or equal to about 400° C. as determined by a thermogravimetric analysis.

In the quantum dot, an amount of a C10+ monocarboxylic acid compound (i.e., a monocarboxylic acid compound having a carbon number of at least 10) may be less than 5 wt % based on a total weight of the quantum dot.

The light emitting device may further include a hole auxiliary layer including a hole injection layer (HIL), a hole transport layer (HTL), an electron blocking layer (EBL), or a combination thereof between the first electrode and the light emitting layer.

The light emitting device may further include an electron auxiliary layer including an electron injection layer (EIL), an electron transport layer (ETL), a hole blocking layer, or a combination thereof between the second electrode and the light emitting layer.

An embodiment provides a display device including the light emitting device.

In the light emitting device of the embodiments, the aforementioned quantum dot may have a controlled energy level and thereby a balance between the electrons and the holes and the quantum yield may be improved. The quantum dot may show improved charge mobility, thereby enhancing electroluminescent properties (e.g., EQE) of a device including the same. When used in a light emitting device, the quantum dot may increase the efficiency of the device. The light emitting device of the embodiments may have improved brightness and lifetime.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
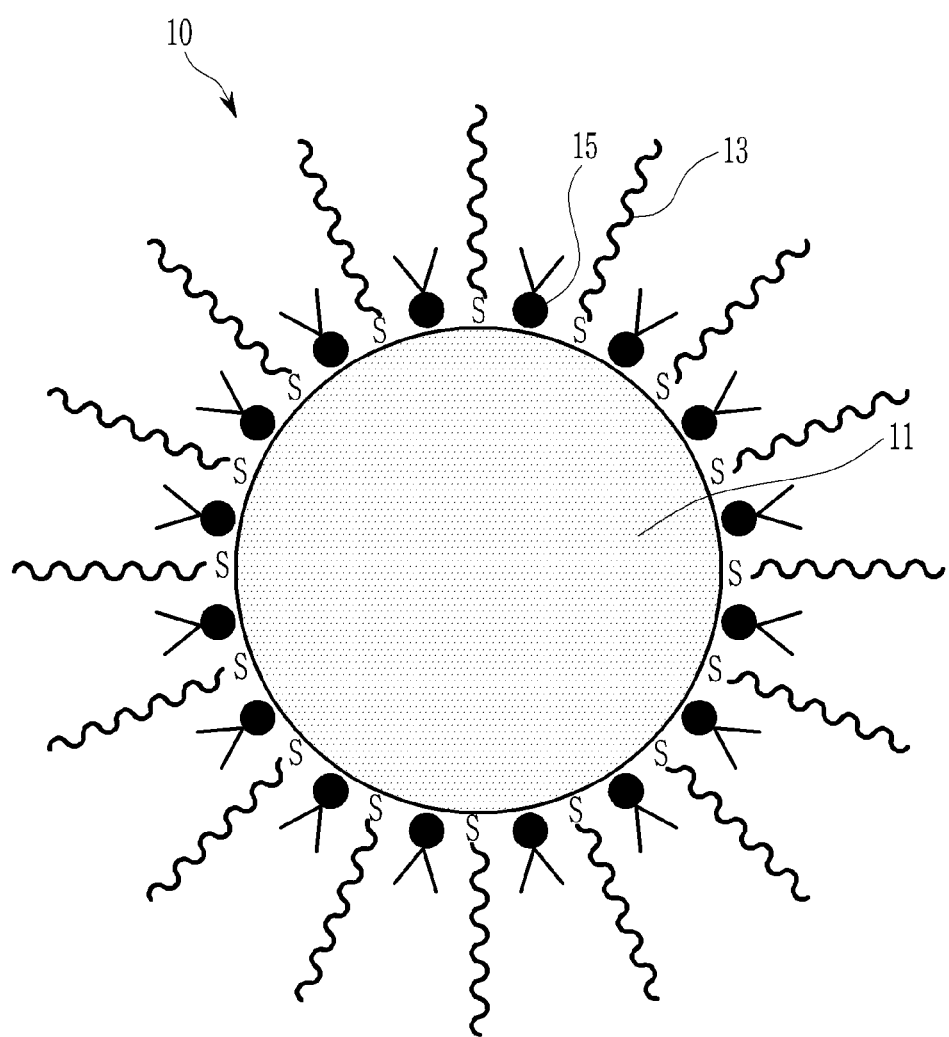
FIG. 1 is a view schematically illustrating an exemplary embodiment of a quantum dot.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In order to clearly illustrate the embodiments in the drawings, some portions not really relevant to the explanation may be omitted.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, the term "substituted" refers to the case where in a compound or a group or a moiety, hydrogen is substituted with a substituent including a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, the term "(meth)acrylate" refers to acrylate and/or methacrylate.

As used herein, when a definition is not otherwise provided, the term "Group" in the term Group III, Group II, and the like refers to a group of Periodic Table.

As used herein, when a definition is not otherwise provided, "Group III" refers to Group IIIA and Group IIIB, and examples of Group III metal may be Al, In, Ga, and Tl, but are not limited thereto.

As used herein, when a definition is not otherwise provided, "Group IV" refers to Group IVA and Group IVB, and examples of a Group IV metal may be Si, Ge, and Sn, but are not limited thereto. As used herein, the term "metal" may include a semi-metal such as Si.

As used herein, when a definition is not otherwise provided, "Group I" refers to Group IA and Group IB, and examples may include Li, Na, K, Rb, and Cs, but are not limited thereto.

As used herein, when a definition is not otherwise provided, "Group V" refers to Group VA, and examples may include N, P, As, Sb, and Bi, but are not limited thereto.

As used herein, when a definition is not otherwise provided, "Group VI" refers to Group VIA, and examples may include S, Se, and Te, but are not limited thereto.

Quantum dot (e.g., a semiconductor nanocrystal particle) may have a theoretical quantum yield of 100% and may emit light of high color purity (e.g., having a full width half maximum of less than or equal to about 40 nanometers (nm)). The quantum dot may contribute to achieving enhanced luminous efficiency and improved color reproducibility when used as a luminous material.

An electroluminescent display device is a type of a display device that can be operated without an external light source. The electroluminescent display device may provide a wide viewing angle, a high contrast, and a quick response time.

The electroluminescent display device includes a light emitting device including an electroluminescent material, wherein an electron and a hole injected from two electrodes respectively combine with each other at a light emitting layer to form an exciton, emitting an energy in a form of light.

The electroluminescent device including a conventional quantum dot shows a high turn-on voltage, a low brightness/quantum efficiency, and a short luminous lifetime. In a conventional quantum dot electroluminescent device, the injection of the holes may lag while the injection of the electrons may be too active, such that obtaining a balance of the electrons and the holes is not easy.

A light emitting device of an embodiment includes a first electrode and a second electrode facing each other; and a light emitting layer disposed between the first electrode and the second electrode and including a quantum dot (e.g., a plurality of quantum dots). The quantum dot includes a semiconductor nanocrystal and a ligand bound to a surface of the semiconductor nanocrystal. The ligand includes an organic thiol ligand or a salt thereof and a polyvalent metal compound including a metal including Zn, In, Ga, Mg, Ca, Sc, Sn, Ti, V, Cr, Mn, Fe, Co, Ni, Cu, Sr, Y, Zr, Nb, Mo, Cd, Ba, Au, Hg, Tl, or a combination thereof. The quantum dot may not include a heavy metal such as cadmium, mercury, and/or lead.

The quantum dot of the embodiment will be explained below, referring to FIG. 1. FIG. 1 shows a schematic view of the quantum dot of a non-limiting embodiment. The quantum dot 10 includes a semiconductor nanocrystal 11 and an organic thiol ligand or a salt thereof 13 and a polyvalent metal compound 15, both of which are bound to a surface of the semiconductor nanocrystal 11. The polyvalent metal compound may be present in the form of a moiety (e.g., as a metal cation and/or its counter ion) derived therefrom. The organic thiol ligand or a salt thereof may be bound to a surface of the quantum dot in the form of a moiety derived from a corresponding thiol compound. The quantum dot may include a core including a first semiconductor nanocrystal and a shell disposed on the core and including a second semiconductor nanocrystal. The second semiconductor nanocrystal may include a different composition from that of the first semiconductor nanocrystal.

As used herein, the semiconductor nanocrystal may refer to a nanocrystal compound not including a ligand.

Types of the semiconductor nanocrystal are not particularly limited and may be any one that is prepared by any method or is a commercially available. For example, the semiconductor nanocrystal (e.g., the first semiconductor nanocrystal and/or the second semiconductor nanocrystal) may include a Group II-VI compound, a Group III-V compound, a Group IV-VI compound, a Group IV element or compound, a Group I-III-VI compound, a Group I-II-IV-VI compound, or a combination thereof.

The Group II-VI compound may include:
a binary element compound including CdSe, CdTe, ZnS, ZnSe, ZnTe, ZnO, HgS, HgSe, HgTe, MgSe, MgS, or a combination thereof;
a ternary element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; and
a quaternary element compound including ZnSeSTe, HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof.

The Group II-VI compound may further include a Group III metal.

The Group III-V compound may include:
a binary element compound including GaN, GaP, GaAs, GaSb, AlN, AlP, AlAs, AlSb, InN, InP, InAs, InSb, or a combination thereof;
a ternary element compound including GaNP, GaNAs, GaNSb, GaPAs, GaPSb, AlNP, AlNAs, AlNSb, AlPAs, AlPSb, InNP, InNAs, InNSb, InPAs, InPSb, InZnP, or a combination thereof; and
a quaternary element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof.

The Group III-V compound may further include a Group II metal (e.g., InZnP).

The Group IV-VI compound may include:
a binary element compound including SnS, SnSe, SnTe, PbS, PbSe, PbTe, or a combination thereof;
a ternary element compound including SnSeS, SnSeTe, SnSTe, PbSeS, PbSeTe, PbSTe, SnPbS, SnPbSe, SnPbTe, or a combination thereof; and a quaternary element compound including SnPbSSe, SnPbSeTe, SnPbSTe, or a combination thereof.

Examples of the Group I-III-VI compound may include $CuInSe_2$, $CuInS_2$, CuInGaSe, and CuInGaS, but are not limited thereto.

Examples of the Group I-II-IV-VI compound may include CuZnSnSe and CuZnSnS, but are not limited thereto.

The Group IV element or compound may include:

a single-element including Si, Ge, or a combination thereof; and a binary element compound including SiC, SiGe, or a combination thereof.

The binary element compound, the ternary element compound, or the quaternary element compound may be respectively included in the particle at a uniform concentration or at partially different concentrations. The quantum dot may include a core including a first semiconductor nanocrystal and a shell disposed on at least a portion (or the entirety) of a surface of the core and including a second semiconductor nanocrystal having a different composition from that of the first semiconductor nanocrystal. At the interface between the core and the shell, an alloyed interlayer may be present or may not be present. The alloyed layer may include a homogeneous alloy. The alloyed layer may have a concentration gradient. In the gradient alloy, the concentration of an element of the shell radially changes (e.g., decreases or increases toward the core). In addition, the shell may include a multi-layered shell having at least two layers wherein adjacent two layers have different compositions from each other. In the multi-layered shell, each layer may have a single composition. In the multi-layered shell, each layer may independently have an alloy. In the multi-layered shell, each layer may have a concentration gradient that radially changes in light of a composition of a semiconductor nanocrystal.

In the core-shell semiconductor nanocrystal particle, the materials of the shell may have a bandgap energy that is larger than that of the core, but it is not limited thereto. The materials of the shell may have a bandgap energy that is smaller than that of the core. In the case of the multi-layered shell, the energy bandgap of the outermost layer material of the shell may be greater than those of the core and the inner layer material of the shell (a layer that is closer to the core). In the case of the multi-layered shell, a semiconductor nanocrystal of each layer is selected to have an appropriate bandgap energy, thereby effectively showing a quantum confinement effect.

The light emitting wavelength of the semiconductor nanocrystal is not particularly limited and may be selected appropriately. The photoluminescent peak wavelength of the semiconductor nanocrystal may be present in a range from an ultraviolet region to a near infrared region. For example, the maximum peak wavelength of the semiconductor nanocrystal may be present within a range from about 420 nm to about 750 nm (e.g., about 460 nm to about 700 nm), but it is not limited thereto.

The semiconductor nanocrystal may have a full width at half maximum (FWHM) of less than or equal to about 45 nm, for example less than or equal to about 40 nm, or less than or equal to about 30 nm. While not wishing to be bound by any theory, it is understood that within such ranges, a device including the semiconductor nanocrystal may have enhanced color purity or improved color reproducibility.

The semiconductor nanocrystal 11 may have a size (e.g., a diameter of a particle, or in the case of a non-spherically shaped particle, a diameter calculated from a two dimensional area determined in an electron microscopic analysis) of about 1 nm to about 100 nm. In some embodiments, the semiconductor nanocrystal 11 may have a particle size of about 1 nm to about 50 nm, for example, from 2 nm (or from 3 nm) to 35 nm. In some embodiments, the semiconductor nanocrystal 11 have a size of greater than or equal to about 1 nm, greater than or equal to about 2 nm, greater than or equal to about 3 nm, greater than or equal to about 4 nm, or greater than or equal to about 5 nm. In some embodiments, the quantum dot have a size of less than or equal to about 50 nm, less than or equal to about 45 nm, less than or equal to about 40 nm, less than or equal to about 35 nm, less than or equal to about 30 nm, less than or equal to about 25 nm, less than or equal to about 20 nm, less than or equal to about 19 nm, less than or equal to about 18 nm, less than or equal to about 17 nm, less than or equal to about 16 nm, or less than or equal to about 15 nm.

The semiconductor nanocrystal 11 may have a shape generally-used in the art, and is not particularly limited. For example, the semiconductor nanocrystal 11 may have a spherical shape, a pyramidal shape, a multi-armed shape, or a cubic shape. The semiconductor nanocrystal 11 may be a nanotube, a nanowire, a nanofiber, or a nanosheet.

The semiconductor nanocrystal 11 may be commercially available or may be synthesized in any method. For example, several nano-sized quantum dots may be synthesized by a wet chemical process. In the wet chemical process, precursors react in an organic solvent to grow nanocrystal particles, and the organic solvent or a ligand compound may coordinate (or be bound) to the surface of the semiconductor nanocrystal, thereby controlling the growth of the semiconductor nanocrystal. Examples of the organic solvent and ligand compound are known.

The quantum dot as prepared may be recovered by pouring an excess amount of a non-solvent to a reaction solution including the quantum dot in order to remove an extra amount of an organic substance that is not coordinate to a surface of the semiconductor nanocrystal and centrifuging the resulting mixture. Examples of the non-solvent may include acetone, ethanol, methanol, and the like, but are not limited thereto.

After the removal of the extra amount of the organic substance, the amount of the organic substance coordinating to the surface of the semiconductor nanocrystal may be less than or equal to about 50 wt %, for example, less than or equal to about 30 wt %, less than or equal to about 20 wt %, less than or equal to about 10 wt %, based on the total weight of the quantum dot. The organic substance may include a ligand compound, an organic solvent, or a combination thereof.

In a light emitting device of an embodiment, the quantum dot 10 includes an organic thiol ligand or a salt thereof 13 and a polyvalent metal compound 15, both of which are bound to (or coordinate to) a surface of the semiconductor nanocrystal 11. The organic thiol ligand or a salt thereof 13 and the polyvalent metal compound 15 may linked to a surface of the semiconductor nanocrystal 11 to provide passivation with the same.

As the quantum dot of the embodiments includes the organic thiol ligand or a salt thereof and the polyvalent metal compound, it may show an enhanced charge (e.g., hole) transporting property. The quantum dot of the embodiment may reduce electron leakage in the electroluminescent device while increasing a hole mobility therein to achieve improved balance between the electrons and holes. In addition, the polyvalent metal compound 15 may be bound to a defect site that may be present on a surface of the semiconductor nanocrystal 11 to improve the quantum yield of the quantum dot 10.

The quantum dot may have a quantum yield (or a quantum efficiency) of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 80%, greater than or equal to about 90%, or even about 100%.

The organic thiol ligand or a salt thereof may include a monothiol or monothiolate having one thiol group. The organic thiol ligand or a salt thereof may include a dithiol or a derivative thereof, wherein two thiol groups are bonded to adjacent two carbon atoms (i.e., disposed in a cis-type configuration), respectively.

The organic thiol ligand or a salt thereof may include a compound represented by Chemical Formula 1:

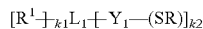  Chemical Formula 1 wherein, $R^1$ is hydrogen, a substituted or unsubstituted C1 to C40 (or C1 to C30) linear or branched alkyl group, a C2 to C30 linear or branched alkenyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C3 to C30 cycloalkyl group, a substituted or unsubstituted C2 to C30 heterocycloalkyl group, a C1 to C10 alkoxy group, a hydroxy group, —$NH_2$, a substituted or unsubstituted C1 to C30 amine group (—NRR', wherein R and R' are independently hydrogen or a C1 to C30 linear or branched alkyl group, and provided that R and R' are not hydrogen simultaneously), an isocyanate group, a halogen, —ROR' (wherein R is a substituted or unsubstituted C1 to C20 alkylene group and R' is hydrogen or a C1 to C20 linear or branched alkyl group), an acyl halide (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' (wherein R and R' are the same or different, and are independently hydrogen or a C1 to C20 linear or branched alkyl group), —C(=O)ONRR' (wherein R and R' are independently hydrogen or a C1 to C20 linear or branched alkyl group) or a combination thereof, $L_1$ is a carbon atom, a nitrogen atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C2 to C30 heterocycloalkylene group, a substituted or unsubstituted C6 to C30 arylene group, a substituted or unsubstituted C3 to C30 heteroarylene group, or a substituted or unsubstituted C2 to C30 alkylene group or a substituted or unsubstituted C3 to C30 alkenylene group having at least one methylene (—$CH_2$—) replaced with sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof, $Y_1$ is a single bond, —C(=S)—, a substituted or unsubstituted C1 to C30 alkylene group, a substituted or unsubstituted C2 to C30 alkenylene group, a substituted or unsubstituted C2 to C30 alkylene group or a substituted or unsubstituted C3 to C30 alkenylene group wherein at least one methylene (—$CH_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, R is hydrogen or a monovalent metal (e.g., an alkali metal such as lithium, sodium, potassium, or the like);

k1 is 0 or an integer of 1 or more, k2 is 1 or 2 provided that when k2 is 2, $Y_1$ is a single bond and the two SR moieties are bonded to adjacent two carbon atoms in the $L_1$ moiety, respectively, and provided that a sum of k1 and k2 does not exceed the valence of Li.

The organic thiol ligand or a salt thereof may not include a carboxylic acid moiety.

The organic thiol ligand or a salt thereof may include a compound represented by Chemical Formula 1-1, Chemical Formula 1-2, or Chemical Formula 1-3:

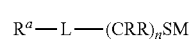  Chemical Formula 1-1

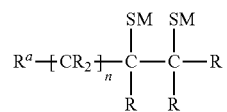  Chemical Formula 1-2

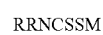  Chemical Formula 1-3
RRNCSSM wherein $R^a$ is a substituted or unsubstituted C1 to C24 alkyl group, a substituted or unsubstituted C2 to C24 alkenyl group, or a substituted or unsubstituted C5 to C20 aryl group, each R is the same or different and is independently hydrogen or a substituted or unsubstituted C1 to C24 alkyl group, n is 0 or an integer of 1 to 15, L is a direct bond, a sulfonyl (—S(=O)$_2$—), carbonyl (—C(=O)—), ether group (—O—), sulfide group (—S—), sulfoxide group (—S(=O)—), ester group (—C(=O)O—), amide group (—C(=O)NR—) (wherein R is hydrogen or a C1 to C10 alkyl group), a substituted or unsubstituted C1 to C10 alkylene, a C2 to C10 alkenylene, or a combination thereof, and M is hydrogen or monovalent metal such as a Group I metal (e.g., lithium, sodium, potassium, or the like) or a combination thereof.

In some embodiments, $R^a$ of Chemical Formula 1-1 may include a C1 to C24 alkyl or C2 to C24 alkynyl group substituted with an alkyloxy group (e.g., methoxy, ethoxy, or propoxy), a hydroxyl group, or a combination thereof. In some embodiments, L of Chemical Formula 1-1 may be a unsubstituted C2 to C10 alkylene or a C3 to C10 alkenylene wherein at least one methylene group may be replaced by a sulfonyl (—S(=O)$_2$—), carbonyl (—C(=O)—), ether group (—O—), sulfide group (—S—), sulfoxide group (—S(=O)—), ester group (—C(=O)O—), amide group (—C(=O)NR—) (wherein R is hydrogen or a C1 to C10 alkyl group), or a combination thereof.

The organic thiol ligand or a salt thereof may include a substituted or unsubstituted C1 to C40 (e.g., C2 to C18) alkyl thiol compound, a substituted or unsubstituted C2 to C40 (e.g., C2 to C18) mercapto carboxylic acid compound, a substituted or unsubstituted C2 to C40 (e.g., C2 to C18) mercapto carboxylic acid alkyl ester compound, a dithiocarbamate compound having a C1 to C40 (e.g., C2 to C18) alkyl group, or a combination thereof.

The organic thiol ligand or a salt thereof may include a thiol compound such as methanethiol, ethanethiol, propanethiol, butanethiol, pentanethiol, hexanethiol, octanethiol, dodecanethiol, hexadecanethiol, octadecanethiol, a benzyl thiol, or the like; a salt thereof wherein the hydrogen of the SH moiety is replaced with a monovalent metal, or the like.

The organic thiol ligand or a salt thereof may include butanethiol, pentanethiol, hexanethiol, heptanethiol, octanethiol, nonanethiol, decanethiol, undecanethiol, dodecanethiol, hexadecanethiol, octadecanethiol, 2-(2-methoxyethoxy)ethanethiol, 3-methoxybutyl 3-mercaptopropionate, 3-methoxybutyl mercaptoacetate, thioglycolic acid, 3-mercaptopropionic acid, thiopronine (a sulfhydryl acylated derivative of glycine), 2-mercaptopropionic acid, 2-mercapto propionate, 2-mercaptoethanol, cysteamine, 1-thioglycerol, mercaptosuccinic acid, L-cysteine, dihydrolipoic acid, 2-(dimethylamino)ethanethiol, 5-mercaptomethyl tetrazole, 2,3-dimercapto-1-propanol glutathione, methoxy polyethylene glycol thiol (m(PEG)-SH), di(C1 to C30 alkyl) dithiocarbamic acid or a salt thereof, e.g., diethyldithiocarbamic acid or diethyldithiocarbamate, or a combination thereof.

The polyvalent metal compound 15 is a compound including a metal having a valency of at least 2 and including Zn, In, Ga, Mg, Ca, Sc, Sn, Ti, V, Cr, Mn, Fe, Co, Ni, Cu, Sr, Y, Zr, Nb, Mo, Cd, Ba, Au, Hg, Tl, or a combination thereof. The polyvalent metal compound may include an organic metal compound, an organic metal salt, an inorganic metal salt, or a combination thereof.

The polyvalent metal compound 15 may include a metal halide, an alkylated metal, a metal carboxylate such as a metal acetate, a metal (meth)acrylate, a metal dialkyldithiocarbamate, or a combination thereof. The metal halide may include a metal chloride, a metal bromide, a metal iodide, a combination thereof, or the like.

The polyvalent metal compound 15 may include a metal chloride such as zinc chloride, indium chloride, cadmium chloride, aluminum chloride, iron chloride, or manganese chloride; an alkylated metal (e.g., diethyl zinc, dipropyl zinc, dibutyl zinc, triethyl aluminum, tributyl aluminum, or the like); an organometallic compound such as a zinc carboxylate (e.g., zinc acetate), zinc (meth)acrylate, zinc diethyldithiocarbamate), a indium carboxylate (e.g., indium acetate); or a combination thereof.

The polyvalent metal compound may include a metal halide and/or an organic metal compound having a relatively short organic functional group. In some embodiments, the polyvalent metal compound may include a compound represented by Chemical Formula 2:

$$MA_n \quad \text{Chemical Formula 2}$$

Wherein M is Mg, Ca, Sc, Sn, Ti, V, Cr, Mn, Fe, Co, Ni, Cu, Zn, Ga, Sr, Y, Zr, Nb, Mo, Cd, In, Ba, Au, Hg, or Tl, n is determined depending on the valency of the M and is an integer of greater than or equal to 2, each A is the same or different, and is independently a C1-C10 (e.g., C1-C9, C1-C8, C1-C7, C1-C6, C1-C5, C1-C4, C1-C3, or C1-C2) organic group (a hydrocarbyl group or an alkyl ester group, or a combination thereof), a halogen (such as F, Cl, Br or I), or a combination thereof.

In some embodiments, the polyvalent metal compound may include a metal that is the same as the metal present on a surface of the quantum dot. For example, when the outermost layer of the quantum dot includes zinc, the M of Chemical Formula 2 may be zinc.

In some embodiments, the A of Chemical Formula 2 may include a C2-C5 organic functional group or a halogen containing group. The A of Chemical Formula 2 may include a C2 to C5 hydrocarbyl group, RCOO— or ROCO— (wherein R is a C1 to C4 hydrocarbyl group), a halogen (e.g., fluorine, chlorine, bromine, or iodine), or a combination thereof.

In some embodiments, the polyvalent metal compound may include an organic metal salt (e.g., a metal acetate, a metal propionate, a metal butyrate, a metal (meth)acrylate, and the like), a halogenated metal such as a metal chloride, a metal bromide, or a metal iodide, a hydrocarbyl metal such as an alkylated metal or an arylated metal, a hydrocarbyl metal halide, or a combination thereof. In some embodiments, the polyvalent metal compound may include a metal chloride such as zinc chloride, indium chloride, cadmium chloride, aluminum chloride, iron chloride, or a manganese chloride; an alkylated metal such as diethyl zinc, dipropyl zinc, dibutyl zinc, triethyl aluminum, tributyl aluminum, or the like; a metal (zinc or indium) carboxylate such as zinc acetate, zinc acrylate, indium acetate, or the like; or a combination thereof. In some embodiments, the polyvalent metal compound may include a zinc acetate, zinc propionate, zinc butyrate, zinc (meth)acrylate, zinc chloride, or a combination thereof.

When used in a quantum dot passivation process, an organic metal ligand having a carbon number of greater than or equal to 11 may not provide sufficient passivation due to the steric hindrance of the organic moiety. A metal ligand having a relatively short carbon chain may efficiently passivate a surface of the quantum dot, thereby increasing the luminous efficiency of the quantum dot. However, the quantum dot passivated only by the metal ligand or the quantum dot passivated by the organic metal ligand having a carbon number of greater than or equal to 11 may cause a sharp increase in a composition viscosity or may cause a gelation of the composition, and thus may not provide a processability necessary for the fabrication of the device. The quantum dot of the embodiments includes the organic thiol ligand or a salt thereof that is bound to a surface thereof together with the polyvalent metal compound, making it possible to realize enhanced luminous properties and desired processability at the same time.

The ratio between the organic thiol ligand or a salt thereof and the polyvalent metal compound may be controlled to provide effective passivation. The polyvalent metal compound 15 may be present in an amount of from about 10 wt % to about 90 wt %, for example, from about 10 wt % to about 50 wt %, from about 15 wt % to about 45 wt %, based on the total amount of the organic thiol ligand or a salt thereof and the polyvalent metal compound. The organic thiol ligand or a salt thereof 13 may be present in an amount of from about 90 wt % to about 10 wt %, for example, from about 50 wt % to about 90 wt %, from about 55 wt % to about 85 wt %, based on the total amount of the organic thiol ligand or a salt thereof and the polyvalent metal compound. The aforementioned ranges may further enhance the hole transporting properties and the quantum yield.

A total amount of the ligand including the organic thiol ligand or a salt thereof and the polyvalent metal compound may be greater than or equal to about 0.1 wt %, for example, greater than or equal to about 1 wt %, greater than or equal to about 2 wt %, greater than or equal to about 3 wt %, greater than or equal to about 4 wt %, greater than or equal to about 5 wt % and less than equal to about 30 wt %, for example, less than equal to about 20 wt %, less than or equal to about 19 wt %, less than or equal to about 18 wt %, less than or equal to about 17 wt %, less than or equal to about 16 wt %, less than or equal to about 15 wt %, less than or equal to about 14 wt %, less than or equal to about 13 wt %, less than or equal to about 12 wt %, or less than or equal to about 10 wt %, based on the total weight of the quantum dot. The foregoing ranges may further enhance the quantum yield of the quantum dot of the embodiments.

In the case of the quantum dot of some embodiments, the organic thiol ligand or a salt thereof and the polyvalent metal compound may efficiently (e.g., more densely) passivate more sites on a surface of the quantum dot. Without wishing to be bound by any theory, the organic thiol ligand or a salt thereof and the polyvalent metal compound may bind the metal element (e.g., zinc) and the non-metal element (e.g., sulfur, selenium, or the like), respectively, and thus more sites present on the surface of the quantum dot may be passivated thereby. In addition, the organic thiol ligand or a salt thereof and the polyvalent metal compound may interact with each other, making it possible to carry out passivation under a minimized steric hindrance. In addition, the surface exchanged quantum dots of the embodiments may show improved compatibility with respect to more types of mediums and thus may be dispersed therein while deterioration of the efficiency may be inhibited, providing improved processability.

The quantum dot 10 including the organic thiol ligand or a salt thereof 13 and the polyvalent metal compound 15 as a first ligand may further include a second organic ligand including RC(=O)OH, RC(=O)OM', RNH$_2$, R$_2$NH, R$_3$N, R$_3$PO, R$_3$P, ROH, RP(=O)(OH)$_2$, R$_2$P(=O)OH, (wherein R is each independently a substituted or unsubstituted C5 to C24 aliphatic hydrocarbon group (e.g., alkyl or alkenyl) or a substituted or unsubstituted C6 to C24 aryl group and M' is a monovalent metal such as a Group I element (e.g., Na)), a polymeric organic ligand, or a combination thereof. In the quantum dots of the embodiments, the amount of the second organic ligand (e.g., a C10+ monocarboxylic acid compound (i.e., a monocarboxylic acid compound having a carbon number of at least 10)) may be less than about 5 wt %, less than or equal to about 4 wt %, less than or equal to about 3 wt %, less than or equal to about 2 wt %, or less than or equal to about 1 wt % based on a total weight of the quantum dot.

Examples of the second organic ligand may include:

carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid, or an ester thereof;

amine compounds such as methylamine, ethylamine, propylamine, butylamine, pentylamine, hexylamine, octylamine, nonylamine, decylamine, dodecylamine, hexadecylamine, octadecylamine, dimethylamine, diethylamine, dipropylamine, tributylamine, or trioctylamine;

alkyl phosphine compounds such as methyl phosphine, ethyl phosphine, propyl phosphine, butyl phosphine, pentyl phosphine, octyl phosphine, dioctyl phosphine, tributyl phosphine, or trioctyl phosphine;

phosphine oxide compounds such as methyl phosphine oxide, ethyl phosphine oxide, propyl phosphine oxide, butyl phosphine oxide, pentyl phosphine oxide, tributyl phosphine oxide, octylphosphine oxide, dioctyl phosphine oxide, or trioctyl phosphine oxide;

diphenyl phosphine, triphenyl phosphine, or oxide compounds thereof;

a C5 to C20 alkylphosphinic acid such as hexylphosphinic acid, octylphosphinic acid, dodecylphosphinic acid, tetradecylphosphinic acid, hexadecylphosphinic acid, or octadecyl phosphinic acid;

and the like, but are not limited thereto.

The quantum dot 10 of the embodiments may be prepared by adding a compound providing the organic thiol ligand or a salt thereof 13 and a polyvalent metal compound 15 to a semiconductor nanocrystal solution and stirring the same to carry out a surface exchange. For example, the quantum dots of the embodiments may be prepared by obtaining a colloidal semiconductor nanocrystal with an organic ligand coordinating to a surface thereof (e.g., prepared by the wet chemical method) and carrying out a surface exchange reaction for the obtained colloidal semiconductor nanocrystal with a compound for the organic thiol ligand or a salt thereof and a compound for the polyvalent metal compound. In some embodiments, the surface exchange reaction may be carried out under relatively simple and mild conditions in terms of a temperature and a reaction time. In some embodiments, the surface exchange reaction may be carried out by contacting the semiconductor nanocrystal with the compound for the organic thiol ligand or a salt thereof and the polyvalent metal compound in an organic solvent under predetermined conditions.

The organic solvent may include a halogenated (e.g., chlorinated) hydrocarbon (e.g., chloroform, dichloroethane, or the like), a substituted or unsubstituted C6 to C40 aromatic hydrocarbon or a derivative thereof such as toluene, xylene, or the like, a substituted or unsubstituted C6 to C40 cycloaliphatic hydrocarbon such as cyclohexane, a cyclohexyl acetate, or the like, a C1 to C10 alcohol such as ethanol, or a combination thereof.

Details for the semiconductor nanocrystals, the polyvalent metal compound, and the organic thiol ligand or a salt thereof are the same as set forth above. The conditions of the surface exchange are not particularly limited and may be selected appropriately depending on the types of the semiconductor nanocrystals, the polyvalent metal compound, and the organic thiol ligand or a salt thereof. In some embodiments, the temperature of the surface exchange may be less than or equal to about 90° C., less than or equal to about 80° C., less than or equal to about 70° C., or even less than or equal to about 65° C. In some embodiments, the surface exchange of the semiconductor nanocrystals may be performed at a relatively low temperature and thus it may become possible to provide a surface exchanged semiconductor nanocrystals (hereinafter, also referred to as a surface exchanged quantum dot) without having an adverse effect on the luminous properties of the semiconductor nanocrystals. In some embodiments, the surface exchange temperature may be greater than or equal to room temperature, for example, greater than or equal to about 20° C., greater than or equal to about 30° C., greater than or equal to about 40° C., or greater than or equal to about 50° C. For example, the temperature of the surface exchange may be from about 40° C. to about 70° C. The surface exchange may be carried out for greater than or equal to about 10 minutes, for example, greater than or equal to about 20 minutes, greater than or equal to about 30 minutes, greater than or equal to about 40 minutes, or greater than or equal to about 50 minutes.

The concentration of the quantum dots in the organic solvent may be selected appropriately and is not particularly limited. For example, the amount of the quantum dots may be greater than or equal to about 0.001 grams (g), for example, greater than or equal to about 0.01 grams (g), greater than or equal to about 0.5 g per 1 milliliter (mL) of the organic solvent. The amount of the quantum dot may be less than or equal to about 3 g, for example, less than or equal to about 2 g per 1 mL of the organic solvent.

With respect to the amount of the quantum dot, the amount of the polyvalent metal compound used in the surface exchange reaction may be greater than or equal to about 5 mol eq. (i.e., 5 molecules of the compound per one quantum dot), for example, greater than or equal to about 10 mol eq., greater than or equal to about 15 mol eq., greater than or equal to about 20 mol eq., greater than or equal to about 30 mol eq., greater than or equal to about 40 mol eq., greater than or equal to about 50 mol eq., greater than or equal to about 60 mol eq., greater than or equal to about 70 mol eq., greater than or equal to about 80 mol eq., greater than or equal to about 90 mol eq., or greater than or equal to about 100 mol eq., but it is not limited thereto. With respect to the amount of the quantum dot, the amount of the polyvalent metal compound may be less than or equal to about 1500 mol eq., for example, less than or equal to about 1000 mol eq., less than or equal to about 900 mol eq., less than or equal to about 800 mol eq., less than or equal to about 700 mol eq., less than or equal to about 600 mol eq., less than or equal to about 500 mol eq., less than or equal to about 400 mol eq., less than or equal to about 300 mol eq., or less than or equal to about 250 mol eq., but it is not limited thereto.

With respect to the amount of the quantum dot, the amount of the organic thiol ligand or a salt thereof used in the surface exchange reaction may be greater than or equal to about 20 mol eq., for example, greater than or equal to about 40 mol eq., greater than or equal to about 50 mol eq., greater than or equal to about 60 mol eq., greater than or equal to about 70 mol eq., greater than or equal to about 80 mol eq., greater than or equal to about 90 mol eq., or greater than or equal to about 100 mol eq., but it is not limited thereto. With respect to the amount of the quantum dot, the amount of the organic thiol ligand or a salt thereof may be less than or equal to about 6000 mol eq., for example, less than or equal to about 5000 mol eq., less than or equal to about 4000 mol eq., less than or equal to about 3000 mol eq., less than or equal to about 2000 mol eq., less than or equal to about 1000 mol eq., less than or equal to about 900 mol eq., less than or equal to about 800 mol eq., less than or equal to about 700 mol eq., less than or equal to about 600 mol eq., less than or equal to about 500 mol eq., or less than or equal to about 400 mol eq., but it is not limited thereto.

The amount ratio between the polyvalent metal compound and the organic thiol ligand or a salt thereof used in the surface exchange reaction may be selected appropriately. In some embodiments, for a stable ligand exchange, the polyvalent metal compound may be used in an appropriate amount (e.g., in an amount that is smaller than that of the thiol compound). For example, per one mole of the polyvalent metal compound, the used amount of the organic thiol ligand or a salt thereof may be greater than or equal to about 0.5 mole, for example, greater than or equal to about 1 mole, greater than 1 mole, greater than or equal to about 2 moles, greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles. In some embodiments, per one mole of the polyvalent metal compound, the used amount of the organic thiol ligand or a salt thereof may be from about 1 moles to about 10 moles, but it is not limited thereto.

The surface exchanged quantum dot may show improved medium dispersability in comparison with the one that does not undergo the surface exchange reaction. The non-solvent for recovering the surface exchanged quantum dots may be selected considering such changes in the dispersability. In some embodiments, the surface exchanged quantum dots may be recovered using a hydrocarbon solvent such as hexane.

In some embodiments, the quantum dot may be prepared by obtaining a dispersion solution including a quantum dot as synthesized (i.e., prior to the ligand exchange) and an organic solvent, applying the dispersion solution to form a film, and then immersing (contacting) the film with a solution including the organic thiol ligand or a salt thereof and the polyvalent metal compound to carry out the surface exchange. The organic solvent is the same as set forth above. The immersing of the film may be carried out at a temperature of about 20° C. to about 100° C., for example, about 20° C. to about 90° C., about 20° C. to about 80° C., about 30° C. to about 50° C., or about 40° C. to about 50° C.

The quantum dot 10 may show improved hole transporting properties and enhanced quantum yield. Thus, a light emitting (e.g., electroluminescent) device including the quantum dot of the embodiments in a light emitting layer may show an improved electron-hole balance and increased luminous properties. The electronic device including the quantum dot of the embodiments may have a reduced resistance, thereby having a lowered turn on voltage and an increased power efficiency.

Figure 2A:
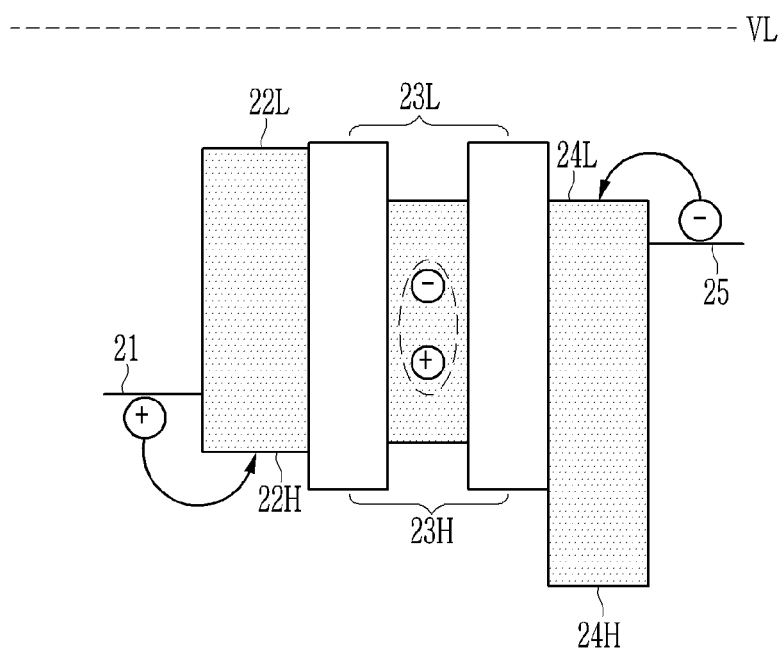
FIG. 2A is an energy diagram of an exemplary embodiment of a light emitting device including a light emitting layer of a quantum dot.
Figure 2B:
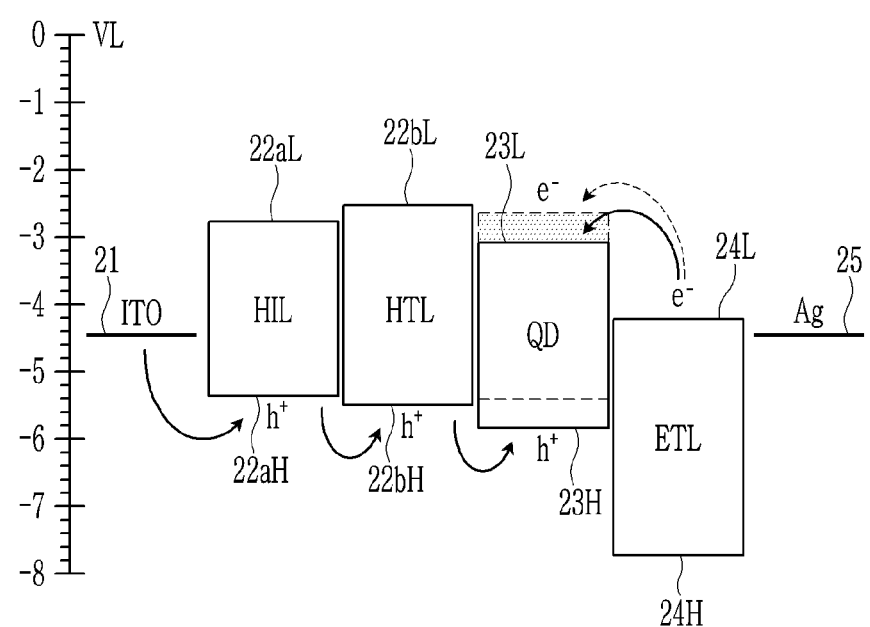
FIG. 2B is an energy diagram of an exemplary embodiment of a light emitting device of an embodiment.

The quantum dot 10 of the embodiments may be used in a light emitting device to improve the balance between the electrons and the holes, which will be further explained with reference of FIGS. 2A and 2B. FIGS. 2A and 2B are schematic diagrams that show an energy level of the light emitting device including the quantum dot.

FIGS. 2A and 2B represent an energy level (eV) with reference to a vacuum level (VL), and the term "work function" means energy required to migrate a charge at a Fermi level to a vacuum level (VL). The HOMO (highest occupied molecular orbital) energy level of each layer is represented as "H" and the LUMO (lowest unoccupied molecular orbital) energy level is denoted as "L."

The light emitting devices of FIGS. 2A and 2B include a first electrode 21, a hole injection layer and a hole transporting layer 22, a emissive layer 23, an electron transport layer 24, and a second electrode 25.

With reference to FIGS. 2A and 2B, a hole is injected from the first electrode 21 (e.g., indium tin oxide (ITO) first electrode), passes the highest occupied molecular orbital (HOMO) 22aH of the hole injection layer (HIL) and the HOMO 22bH of the hole transport layer (HTL) (e.g., collectively 22H; in contrast to the lowest unoccupied molecular orbital (LUMO) 22aL of the HIL and the LUMO 22bL of the HTL, collectively 22L), and reaches the HOMO 23H of the emissive layer 23, and the electron is injected from the second electrode 25 (e.g., Ag second electrode), passes the LUMO 24L of the electron transport layer (ETL) (in contrast to the HOMO 24H of ETL), and reaches the LUMO 23L of the emissive layer 23. The hole and the electron are recombined at the emissive layer (e.g., QD emissive layer). Conventional quantum dots tend to have a low HOMO energy level 23H and thus the hole may have difficulties in its move. However, the quantum dot including the modifying ligand of the embodiments may have a controlled (e.g., increased) HOMO energy level 23H to improve the mobility of the hole.

In the light emitting device (e.g., diode) of the embodiments, the emissive layer including the aforementioned quantum dots (e.g., a plurality of the quantum dots) are disposed between the anode and the cathode facing each other.

Figure 3:
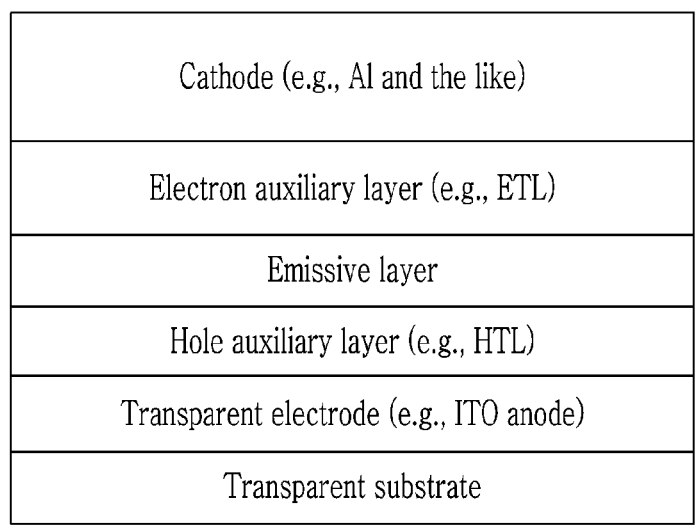
FIG. 3 is a cross-sectional view of an exemplary embodiment of a light emitting device.

In some embodiments, an anode disposed on a transparent substrate may include a metal oxide transparent electrode (e.g., ITO electrode) and a cathode facing the anode may include a metal (Mg, Al, etc.) having a predetermined (e.g., relatively low) work function. For example, poly(3,4-ethylenedioxythiophene):poly(styrenesulfonate) (PEDOT:PSS) and/or a p-type metal oxide (and/or TFB and/or PVK) may be disposed between the transparent electrode and the emission layer, as a hole injection layer (and/or a hole transport layer HTL, respectively). An electron auxiliary layer (e.g., electron transport layer) may be disposed between the quantum dot emissive layer and the cathode (see FIG. 3).

A device according to an embodiment may have an inverted structure.

Figure 4:
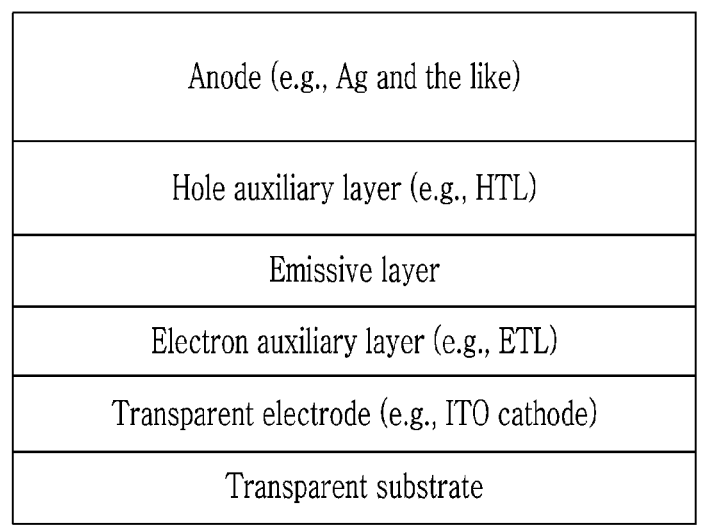
FIG. 4 is a cross-sectional view of an exemplary embodiment of a light emitting device.

Herein, a cathode disposed on a transparent substrate may include a metal oxide transparent electrode (e.g., ITO, fluorine doped tin oxide (FTO)) and an anode facing the cathode may include a metal (Au, Ag etc.) of a predetermined (e.g., relatively high) work function. For example, an n-type metal oxide (ZnO) may be disposed between the transparent electrode and the emissive layer as an electron auxiliary layer (e.g., an electron transport layer). MoO$_3$ or another p-type metal oxide may be disposed between the metal anode and the quantum dot emission layer as a hole auxiliary layer (e.g., a hole injection layer (see FIG. 4). The TFB and/or the PVK may be disposed between the transparent electrode and the emission layer as a hole transport layer HTL.

Figure 5:
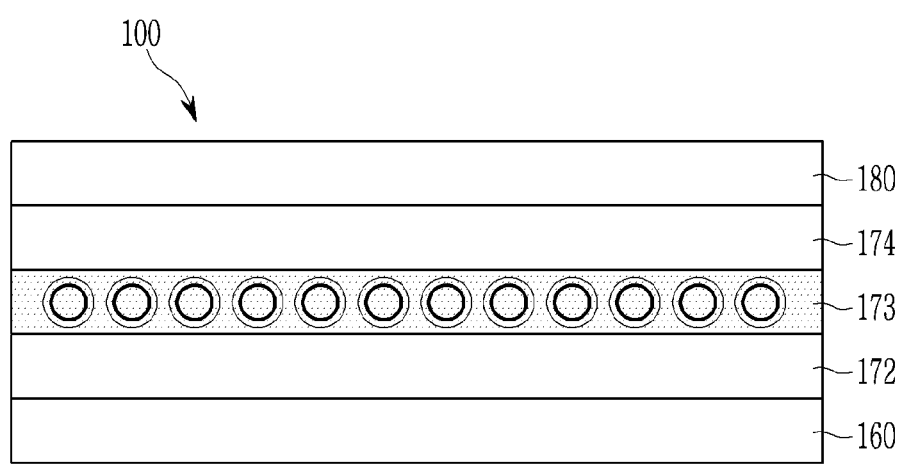
FIG. 5 is a cross-sectional view of an exemplary embodiment of a light emitting device.
Figure 6:
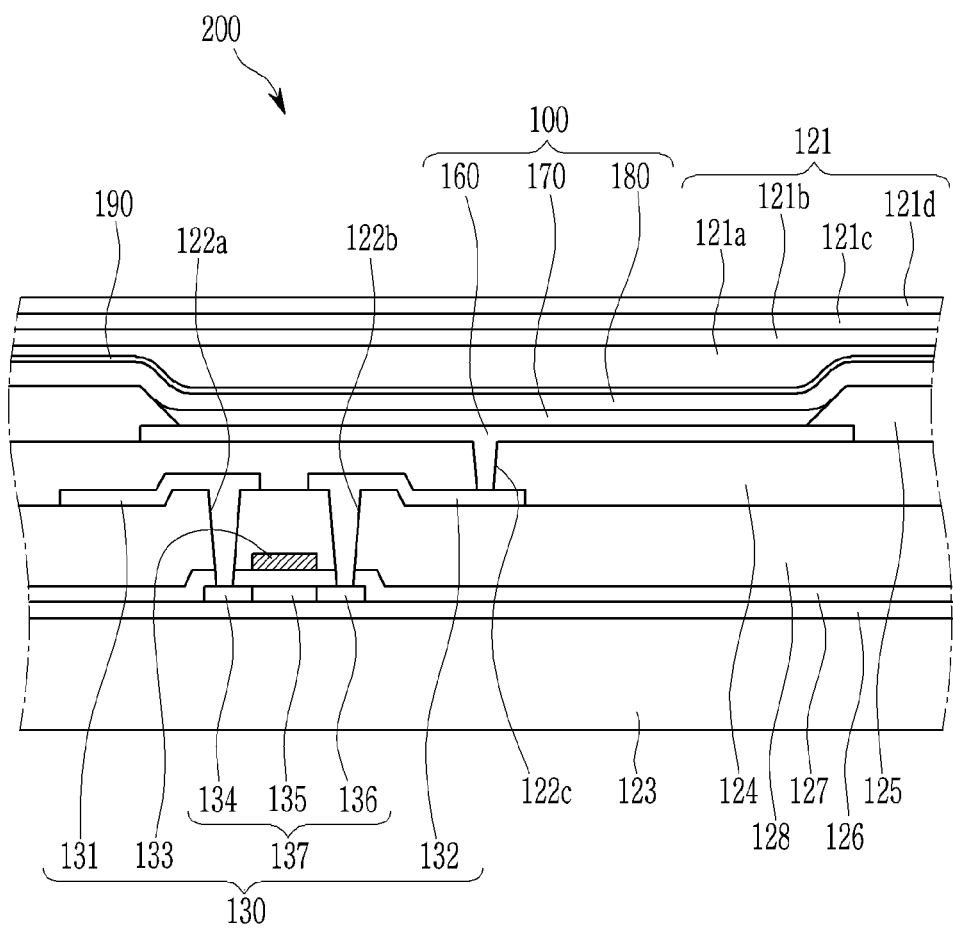
FIG. 6 is a cross-sectional view of an exemplary embodiment of a display device.

Hereinafter, explanation regarding the light emitting device of the embodiments and a display device including the same will be provided with reference to FIG. 5 and FIG. 6. FIG. 5 is a cross-sectional view of a light emitting device according to an exemplary embodiment, and FIG. 6 is a cross-sectional view of a display device according to an exemplary embodiment. Although the structure of the display device shown in FIG. 6 includes a driving thin film transistor and a light emitting device, the structure of the display device may further include a switching thin film transistor, a signal line, and the like.

Referring to FIG. 5, the light emitting device according to an exemplary embodiment may have a structure in which a first electrode 160, a hole auxiliary layer 172, an emission layer 173, an electron auxiliary (e.g., transport) layer 174, and a second electrode 180 are sequentially stacked. A light emitting element layer 170 of FIG. 6, which will be described below, includes the hole auxiliary layer 172, the emission layer 173, and the electron transport layer 174 of FIG. 5.

When the first electrode 160 is an anode, the first electrode 160 may include a material having a high work function for easy hole injection.

The first electrode 160 according to the exemplary embodiment is a transparent electrode, and may be formed of a conductive oxide such as indium tin oxide (ITO), indium zinc oxide (IZO), zinc tin oxide (ZTO), copper indium oxide (CIO), copper zinc oxide (CZO), gallium zinc oxide (GZO), aluminum zinc oxide (AZO), tin oxide (SnO$_2$), zinc oxide (ZnO), or a combination thereof, a metal such as calcium (Ca), ytterbium (Yb), aluminum (Al), silver (Ag), and magnesium (Mg), a conductive carbon such as graphene or carbon nanotubes, or a conductive polymer such as PEDOT:PSS, for example, with a small thickness.

The first electrode 160 is not limited thereto and may have a structure in which two or more layers are layered.

The hole auxiliary layer 172 may be provided between the first electrode 160 and the emission layer 173. In this case, the hole auxiliary layer 172 may be a hole injection layer facilitating the injection of the hole from the first electrode 160 to the emissive layer 173 and/or a hole transport layer facilitating the transport of the holes.

In addition, the hole auxiliary layer 172 may include an electron blocking layer that block the move of the electron.

The hole injection layer and/or the hole transport layer may include for example poly(3,4-ethylenedioxythiophene):poly(styrenesulfonate (PEDOT:PSS), poly(9,9-dioctyl-fluorene-co-N-(4-butylphenyl)-diphenylamine) (TFB), polyarylamine, poly(N-vinylcarbazole) (PVK), polyaniline, polypyrrole, N,N,N',N'-tetrakis(4-methoxyphenyl)-benzidine (TPD), 4, 4'-bis[N-(1-naphthyl)-N-phenyl-amino]biphenyl (α-NPD), m-MTDATA (4,4',4"-Tris[phenyl(m-tolyl)amino]triphenylamine), 4,4',4"-tris(N-carbazolyl)-triphenylamine (TCTA), 1,1-bis[(di-4-toylamino)phenylcyclohexane (TAPC), or a combination thereof, but is not limited thereto.

In FIG. 5, the hole auxiliary layer 172 is formed as a single layer, but it is not limited thereto and may include a plurality of layers including at least two stacked layers.

The difference between the energy level of the hole auxiliary layer and the energy level of the emissive layer including a conventional quantum dot may be inappropriate (e.g., the gap therebetween being too wide) and thus the hole injection from the hole transport layer to the emissive layer may not go smoothly, e.g., may lag. However, adopting the quantum dot of the embodiments may make it possible to control the energy level difference therebetween, thereby facilitating the hole injection from the hole transport layer to the emissive layer.

The facilitated hole injection may further improve the balance between the electrons and the holes, both of which are recombined in the emissive layer and this may in turn enhance the stability and increase the luminous efficiency of the light emitting device of the embodiments.

The emissive layer 173 may be disposed on the hole auxiliary layer 172. The emissive layer 173 includes the quantum dots of the foregoing embodiments. For example, the emissive layer 173 may represent a basic color such as blue, green, or red or a combined color thereof. The emissive layer may be formed by preparing a dispersion including the quantum dots dispersed in a solvent, applying the dispersion via a spin coating, an ink jet coating, or a spray coating, and drying the same. The emissive layer may have a thickness of greater than or equal to about 5 nm, for example, from about 10 nm to about 100 nm, for example, from about 10 nm to about 50 nm or about 15 nm to about 30 nm.

An electron auxiliary layer 174 may be disposed on the emissive layer 173. The electron auxiliary layer 174 may be disposed between the emissive layer 173 and the second electrode 180. The electron auxiliary layer 174 may be an electron injection layer facilitating the injection of the electrons from the second electrode to the emissive layer 173 and/or an electron transport layer facilitating the transport of the electrons.

The electron auxiliary layer 174 may include a hole blocking layer that blocks the holes.

The electron transport and/or injection layer may include, for example, at least one of 1,4,5,8-naphthalene-tetracarboxylic dianhydride (NTCDA), bathocuproine (BCP), tris[3-(3- pyridyl)-mesityl]borane (3TPYMB), LiF, Alq$_3$, Gaq$_3$, Inq$_3$, Znq$_2$, Zn(BTZ)$_2$, BeBq$_2$, or a combination thereof, but is not limited thereto.

The hole blocking layer may include, for example, at least one of 1,4,5,8-naphthalene-tetracarboxylic dianhydride (NTCDA), bathocuproine (BCP), tris[3-(3-pyridyl)-mesityl]borane (3TPYMB), LiF, Alq$_3$, Gaq$_3$, Inq$_3$, Znq$_2$, Zn(BTZ)$_2$, BeBq$_2$, or a combination thereof, but is not limited thereto.

In FIG. 5, the electron auxiliary layer 174 is formed as a single layer, but it is not limited thereto and may include a plurality of layers including at least two stacked layers.

The second electrode 180 is disposed on the electron auxiliary layer 174. In the light emitting device of the embodiments, the first electrode 160 may be an anode, and the second electrode 180 may be a cathode, but it is not limited thereto. The first electrode 160 may be a cathode, and the second electrode 180 may be an anode.

The second electrode 180 may be a transparent electrode. The second electrode 180 may be formed of a conductive oxide such as indium tin oxide (ITO), indium zinc oxide (IZO), zinc tin oxide (ZTO), copper indium oxide (CIO), copper zinc oxide (CZO), gallium zinc oxide (GZO), aluminum zinc oxide (AZO), tin oxide (SnO$_2$), zinc oxide (ZnO), or a combination thereof, a metal such as calcium (Ca), ytterbium (Yb), aluminum (Al), silver (Ag), and magnesium (Mg), a conductive carbon such as graphene or carbon nanotubes, or a conductive polymer such as PEDOT:PSS, with a small thickness.

Hereafter, in a non-limiting embodiment, a display device including the foregoing light emitting device will be described with reference to FIG. 6.

Referring to FIG. 6, a buffer layer 126 may be provided on a substrate 123. The buffer layer 126 may prevent permeation of an impurity, and may flatten the surface of the substrate 123.

A semiconductor layer 137 may be provided on the buffer layer 126. The semiconductor layer 137 may be formed with a polycrystalline silicon.

The semiconductor layer 137 may include a channel region 135 that is not doped with an impurity, a source region 134, and a drain region 136. The source region 134 and the drain region 136 are disposed at opposite sides of the channel region 135, and each of the source region 134 and the drain region 136 may be doped, respectively. Here, the doped ion impurity may vary with the type of a thin film transistor.

A gate insulating layer 127 may be provided on the semiconductor layer 137, and a gate wire including a gate electrode 133 may be provided on the gate insulating layer 127. In this case, the gate electrode 133 may be disposed to overlap at least a part of the semiconductor layer 137, particularly, the channel region 135.

An interlayer insulating layer 128 may be provided on the gate insulating layer 127 and the gate electrode 133. A first contact hole 122a and a second contact hole 122b that overlap the source region 134 and the drain region 136 of the semiconductor layer 137 may be provided in the gate insulating layer 127 and the interlayer insulating layer 128.

Data wires including a source electrode 131 and a drain electrode 132 may be provided on the interlayer insulating layer 128.

The source electrode 131 and the drain electrode 132 are respectively electrically connected with the source region 134 and the drain region 136 of the semiconductor layer 137 through the first contact hole 122a and the second contact hole 122b respectively provided in the interlayer insulating layer 128 and the gate insulating layer 127.

The aforementioned semiconductor layer 137, the gate electrode 133, the source electrode 131, and the drain electrode 132 may constitute a thin film transistor 130, but the configuration of the thin film transistor 130 is not limited to the aforementioned example, and may be variously modified as a known configuration which may be easily implemented by those skilled in the art.

Next, a planarization layer 124 may be provided on the interlayer insulating layer 128 and the data wire. The planarization layer 124 may remove and/or planarized a step, e.g., a height difference between the insulating layer 128 and the source electrode 131 and/or the drain electrode 132 included in the data wire, in order to increase emission efficiency of the light emitting element to be provided thereon.

The planarization layer 124 may have a third contact hole 122c overlapping the drain electrode 132.

An exemplary embodiment is not limited to the aforementioned structure, and in some cases, one of the planarization layer 124 and the interlayer insulating layer 128 may be omitted.

Next, a first electrode 160 included in a light emitting device 100 may be provided on the planarization layer 124. The first electrode 160 may be a pixel electrode. The first electrode 160 may be connected with the drain electrode 132 through the third contact hole 122c of the planarization layer 124.

A pixel defining layer 125 having an opening overlapping the first electrode 160 may be provided on the planarization layer 124. The light emitting element layer 170 may be provided for each opening that is included in the pixel defining layer 125. That is, a pixel area in which each light emitting element layer 170 is formed by the pixel defining layer 125 may be defined.

The light emitting element layer 170 may be provided on the first electrode 160. As described with reference to FIG. 5, the light emitting element layer 170 may include the hole auxiliary layer 172, the emission layer 173, and the electron auxiliary layer 174, its configuration is the same as that described above, and the description thereof will be omitted below.

The second electrode 180 may be provided on the light emitting element layer 170. The second electrode 180 may be a common electrode. The first electrode 160, the light emitting element layer 170, and the second electrode 180 may constitute the light emitting device 100.

The first electrode 160 and the second electrode 180 may be made of a transparent conductive material or a transflective or reflective conductive material. Depending on the types of the materials that form the first electrode 160 and the second electrode 180, the display device 200 may be a top emission type, a bottom emission type, or a double-sided emission type.

An overcoat 190 protecting the second electrode 180 may be provided on the second electrode 180.

A thin film encapsulation layer 121 may be provided on the overcoat 190. The thin film encapsulation layer 121 may encapsulate and protect the light emitting device and a circuit part (not shown) provided on the substrate 123 from the external environment.

The thin film encapsulation layer 121 may include organic encapsulation layers 121a and 121c and inorganic encapsulation layers 121b and 121d which are alternately laminated. In FIG. 2, for example, a case where two organic encapsulation layers 121a and 121c and two inorganic encapsulation layers 121b and 121d are alternately laminated to configure the thin film encapsulation layer 121 is illustrated, but it is not limited thereto, and the structure of the thin film encapsulation layer 121 can be variously modified as necessary.

Hereinafter, the embodiments are illustrated in more detail with reference to examples. However, the present disclosure is not limited thereto.

EXAMPLES

Analysis Method

[1] Photoluminescence Analysis

A Hitachi F-7000 spectrometer is used to perform a photoluminescence spectrum analysis with irradiation light of 458 nanometers (nm) (532 nm for red QD). The photoluminescence spectrum of the quantum dots is obtained.

[2] Quantum Yield

The quantum yield is obtained by dividing the number of the photons emitted from the sample by the number of the photons absorbed by the sample. The quantum yield is measured by using HAMAMATSU-Quantaurus-QY, C11347 (purchased from Hamamatsu Co., Ltd.) with respect to a quantum dot containing composition or a quantum dot polymer composite.

[3] Thermogravimetric Analysis

A thermogravimetric analysis is carried out by using TA Q5000 (Q5000IR) (manufactured from TA instruments Co. Ltd.)

[4] XPS Analysis

Quantum 2000 made by Physical Electronics, Inc. is used to perform an XPS element analysis under a condition of an acceleration voltage: 0.5-15 kiloelectron volts (keV), 300 watts (W), and a minimum analysis area: 200×200 micrometers squared ($\mu m^2$).

[5] Electroluminescence Analysis

An electroluminescent spectrum is obtained by using a current-voltage (IV) tester 2635B manufactured by Keithley Co., Ltd. and CS-2000A of Konica Minolta Co., Ltd.

[6] Gas Chromatography Mass Spectrometry (GC-MS)

A GC-MS analysis is made using Agilent 7890A GC system manufactured by Agilent Technologies Co. Ltd.

Preparation of Quantum Dots

Reference Example 1

[1] Preparation of InP Core 0.4 millimoles (mmol) of indium acetate, 1.2 mmol of palmitic acid, and 10 milliliters (mL) of trioctylamine are placed in a flask, subjected to a vacuum state at 120° C. for one hour (h), and heated to 280° C. after the atmosphere in the flask is exchanged with $N_2$. Then, a solution including 0.2 mmol of tris(trimethylsilyl)phosphine ($TMS_3P$) is quickly injected, and the reaction proceeds for a predetermined time. The resulting solution is then rapidly cooled to room temperature and acetone is added thereto to make a precipitation, which is then separated by centrifugation and dispersed in toluene.

[2] Preparation of InP/ZnSeS Core/Shell Quantum Dot Emitting Red Light (RQD)

0.9 mmol of zinc acetate, 1.8 mmol of oleic acid, and 10 mL of trioctylamine are placed in a flask, subjected to a vacuum state at 120° C. for 10 minutes, and then heated to 280° C. after the atmosphere in the flask is exchanged with $N_2$. Then, a toluene dispersion of the InP core nanocrystals prepared as described above (OD=optical density of $1^{st}$ excitonic absorption, OD=0.45) is quickly injected and then 0.6 mmol Se/trioctylphosphine (TOP) (i.e., Se dispersed in TOP) and 0.2 mmol S/TOP (i.e., S dispersed in TOP) are added to the flask, and then the reaction proceeds for 120 minutes. After the completion of the reaction, the reaction solution is quickly cooled to room temperature and ethanol is added thereto to make a precipitation, which is then centrifuged to obtain quantum dots, and the quantum dots are redispersed in toluene. The prepared InP/ZnSeS quantum dots have a PL peak wavelength of about 630 nm and a quantum yield of about 60%.

Reference Example 2

[1] Preparation of InZnP Core 0.6 mmol of indium acetate, 1.8 mmol of palmitic acid, 0.3 mmol of zinc oleate, and 10 milliliters (mL) of trioctylamine are placed in a flask, subjected to a vacuum state at 120° C. for one hour, and heated to 280° C. after the atmosphere in the flask is exchanged with $N_2$. Then, a solution including 0.3 mmol of tris(trimethylsilyl)phosphine ($TMS_3P$) is quickly injected, and the reaction proceeds for a predetermined time. The resulting solution is then rapidly cooled to room temperature and acetone is added thereto to make a precipitation, which is then separated by centrifugation and dispersed in toluene.

[2] Preparation of InZnP/ZnSeS Core/Shell Quantum Dot Emitting Green Light (GQD)

0.9 mmol of zinc acetate, 1.8 mmol of oleic acid, and 10 mL of trioctylamine are placed in a flask, subjected to a vacuum state at 120° C. for 10 minutes, and then heated to 280° C. after the atmosphere in the flask is exchanged with $N_2$. Then, a toluene dispersion of the InZnP core nanocrystal prepared as described above (OD=optical density of $1^{st}$ excitonic absorption, OD=0.45) is quickly injected and then 0.6 mmol Se/TOP and 0.2 mmol S/TOP are added to the flask, and then the reaction proceeds for 120 minutes. After the completion of the reaction, the reaction solution is quickly cooled to room temperature and ethanol is added thereto to make a precipitation, which is then centrifuged to obtain quantum dots, and the quantum dots are redispersed in toluene or chloroform. The prepared InZnP/ZnSeS quantum dots have a PL peak wavelength of about 530 nm and a quantum yield of about 60%.

Reference Example 3

[1] Preparation of ZnSe Based Core

A 2 M Se/TOP stock solution containing selenium in trioctylphosphine (TOP) is prepared. In a 400 mL reaction flask, a trioctylamine solution including 0.125 mmol of zinc acetate and 0.25 mmol of palmitic acid is prepared and then heated under a vacuum at 120° C. After one hour, an atmosphere in the reactor is replaced with nitrogen.

After being heated at 300° C., the prepared Se/TOP stock solution is rapidly injected and the reaction process for one hour. After the reaction, the resulting solution is then cooled to room temperature and acetone is added thereto to make a precipitation, which is then separated by centrifugation and dispersed in toluene.

[2] Preparation of ZnSe Based Core/ZnSeS Shell (Hereinafter Also Referred to ZnSe/ZnSeS Quantum Dot) Emitting Blue Light (BQD)

0.9 mmol of zinc acetate, 1.8 mmol of oleic acid, and 10 mL of trioctylamine are placed in a flask, subjected to a vacuum state at 120° C. for 10 minutes, and then heated to 280° C. after the atmosphere in the flask is exchanged with $N_2$. Then, a toluene dispersion of the ZnSe core nanocrystal prepared as described above (OD=optical density of $1^{st}$ excitonic absorption, OD=0.45) is quickly injected and then 0.6 mmol Se/TOP and 0.2 mmol S/TOP are added to the flask, and then the reaction proceeds for 120 minutes. After the completion of the reaction, the reaction solution is quickly cooled to room temperature and ethanol is added thereto to make a precipitation, which is then centrifuged to obtain quantum dots, and the quantum dots are redispersed in toluene or chloroform. The prepared ZnSe/ZnSeS quantum dots have a PL peak wavelength of about 450 nm and a quantum yield of about 60%.

Preparation Example 1: Synthesis and Characterization of ZA-DDT Exchanged RQD and GQD

[1] To 100 g of the InP/ZnSeS red light emitting quantum dot (RQD) solution of Reference Example 1 or the InZnP/ZnSeS green light emitting quantum dot (GQD) solution of Reference Example 2 (quantum dot amount: 1.5 g), 0.2 g of zinc acrylate (ZA) and 1.4 g of dodecanethiol (DDT) are added. The obtained reaction solution is stirred at 40° C. for 30 minutes.

After the stirring, a non-solvent is added to the reaction solution to precipitate quantum dots, which is then centrifuged to provide a quantum dot surface exchanged with the zinc acrylate and the dodecanethiol (hereinafter, ZA-DDT RQD or ZA-DDT GQD). The ZA-DDT RQD or the ZA-DDT GQD is re-dispersed in chloroform.

[2] A thermogravimetric analysis and a GC-Mass analysis are made for the obtained ZA-DDT RQD and the obtained ZA-DDT GQD. The results confirm that most of the original surface ligand (i.e., the oleic acid) of the as-synthesized quantum dot is replaced with the zinc acrylate (ZA) and the dodecanethiol (DDT).

Preparation Example 2: Synthesis and Characterization of ZnCl-OT Exchanged RQD and GQD The surface exchange treatment is conducted in the same manner as set forth in Preparation Example 1 except for using zinc chloride ($ZnCl_2$, hereinafter ZnCl) instead of the zinc acrylate and using octanethiol instead of the dodecanethiol to obtain a quantum dot surface exchanged with the zinc chloride and the octanethiol (hereinafter, ZnCl-OT RQD and ZnCl-OT GQD). The surface exchanged quantum dot as obtained is re-dispersed in chloroform.

[2] A thermogravimetric analysis and a GC-Mass analysis are made for the obtained ZnCl-OT RQD and the obtained ZnCl-OT GQD. The results confirm that most of the original surface ligand (i.e., the oleic acid) of the as-synthesized quantum dot is replaced with the zinc chloride (ZnCl) and the octanethiol (OT).

Preparation Example 3: Synthesis and Characterization of ZA-DDT Exchanged BQD

[1] To 100 g of the ZnSe/ZnSeS blue light emitting quantum dot (BQD) solution of Reference Example 3 (quantum dot amount: 1.5 g), 0.2 g of zinc acrylate (ZA) and 1.4 g of dodecanethiol (DDT) are added. The obtained reaction solution is stirred at 40° C. for 30 minutes.

After the stirring, a non-solvent is added to the reaction solution to precipitate quantum dots, which is then centrifuged to provide a blue light emitting quantum dot surface exchanged with the zinc acrylate and the dodecanethiol (hereinafter, ZA-DDT BQD). The ZA-DDT BQD is re-dispersed in chloroform.

[2] A thermogravimetric analysis and a GC-Mass analysis are made for the obtained ZA-DDT BQD. The results confirm that most of the original surface ligand (i.e., the oleic acid) of the as-synthesized quantum dot is replaced with the zinc acrylate (ZA) and the dodecanethiol (DDT).

Preparation Example 4: Synthesis and Characterization of ZnCl-OT Exchanged BQD

The surface exchange treatment is conducted in the same manner as set forth in Preparation Example 3 except for using zinc chloride ($ZnCl_2$, hereinafter ZnCl) instead of the zinc acrylate and using octanethiol instead of the dodecanethiol to obtain a blue light emitting quantum dot surface exchanged with the zinc chloride and the octanethiol (hereinafter, ZnCl-OT BQD). The surface exchanged quantum dot as obtained is re-dispersed in chloroform.

[2] A thermogravimetric analysis and a GC-Mass analysis are made for the obtained ZnCl-OT BQD. The results confirm that most of the surface ligand (i.e., the oleic acid) of the as-synthesized quantum dot is replaced with the zinc chloride (ZnCl) and the octanethiol (OT).

Preparation Example 5-1: Synthesis and Characterization of ZnCl-DDT Exchanged BQD-1

[1] The surface exchange treatment is conducted in the same manner as set forth in Preparation Example 3 except for using zinc chloride ($ZnCl_2$, hereinafter ZnCl) instead of the zinc acrylate to obtain a blue light emitting quantum dot surface exchanged with the zinc chloride and the dodecanethiol (hereinafter, ZnCl-DDT BQD-1). The surface exchanged quantum dot as obtained is re-dispersed in chloroform.

[2] A thermogravimetric analysis and a GC-Mass analysis are made for the obtained ZnCl-DDT BQD-1. The results confirm that most of the original surface ligand (i.e., the oleic acid) of the as-synthesized quantum dot is replaced with the zinc chloride (ZnCl) and the dodecanethiol (DDT).

Preparation Example 5-2: Synthesis and Characterization of ZnCl-DDT Exchanged BQD-2

[1] The surface exchange treatment is conducted twice in the same manner as set forth in Preparation Example 3 except for using zinc chloride ($ZnCl_2$, hereinafter ZnCl) instead of the zinc acrylate to obtain a blue light emitting quantum dot surface exchanged with the zinc chloride and the dodecanethiol (hereinafter, ZnCl-DDT BQD-2). The surface exchanged quantum dot as obtained is re-dispersed in chloroform.

[2] A thermogravimetric analysis and a GC-Mass analysis are made for the obtained ZnCl-DDT BQD-2. The results confirm that most of the original surface ligand (i.e., the oleic acid) of the as-synthesized quantum dot is replaced with the zinc chloride (ZnCl) and the dodecanethiol (DDT).

[3] The quantum yield of the obtained ZnCl-DDT BQD-2 is about 90% as measured.

Comparative Preparation Example 1: DDT Exchanged RQD

To 100 g of the InP/ZnSeS red light emitting quantum dot (RQD) solution of Reference Example 1, 2 g of dodecanethiol (DDT) is added and the obtained reaction solution is stirred at 40° C. for 30 minutes.

After the stirring, a non-solvent is added to the reaction solution to precipitate quantum dots, which is then centrifuged to provide a red light emitting quantum dot surface exchanged with the dodecanethiol (hereinafter, DDT RQD). The DDT RQD thus obtained is re-dispersed in chloroform.

Comparative Preparation Example 2: DDT Exchanged BQD

The surface exchange treatment is conducted in the same manner as set forth in Preparation Example 3 except for not using the zinc acrylate and only adding 2 g of dodecanethiol to 100 g of the ZnSe/ZnSeS blue light emitting quantum dot (BQD) to obtain a blue light emitting quantum dot surface exchanged with the dodecanethiol (hereinafter, DDT BQD). The surface exchanged quantum dot as obtained is re-dispersed in chloroform.

Comparative Preparation Example 3: OT Exchanged BQD

The surface exchange treatment is conducted in the same manner as set forth in Preparation Example 3 except for not using the zinc acrylate and the DDT and adding 2 g of octanethiol to 100 g of the ZnSe/ZnSeS blue light emitting quantum dot (BQD) to obtain a blue light emitting quantum dot surface exchanged with the octanethiol (hereinafter, OT BQD). The surface exchanged quantum dot as obtained is re-dispersed in chloroform.

Experimental Example 1: Dispersion Stability in Cyclohexane I

The quantum dots of Reference Example 1 and the surface exchanged red-light emitting quantum dots obtained in Preparation Example 1 (i.e., ZA-DDT RQD) are separated and dispersed in cyclohexane, respectively to obtain quantum dot dispersion A including the quantum dots having the oleic acid as a surface ligand (hereinafter OA RQD) and quantum dot dispersion B including the ZA-DDT RQD.

Figure 7:
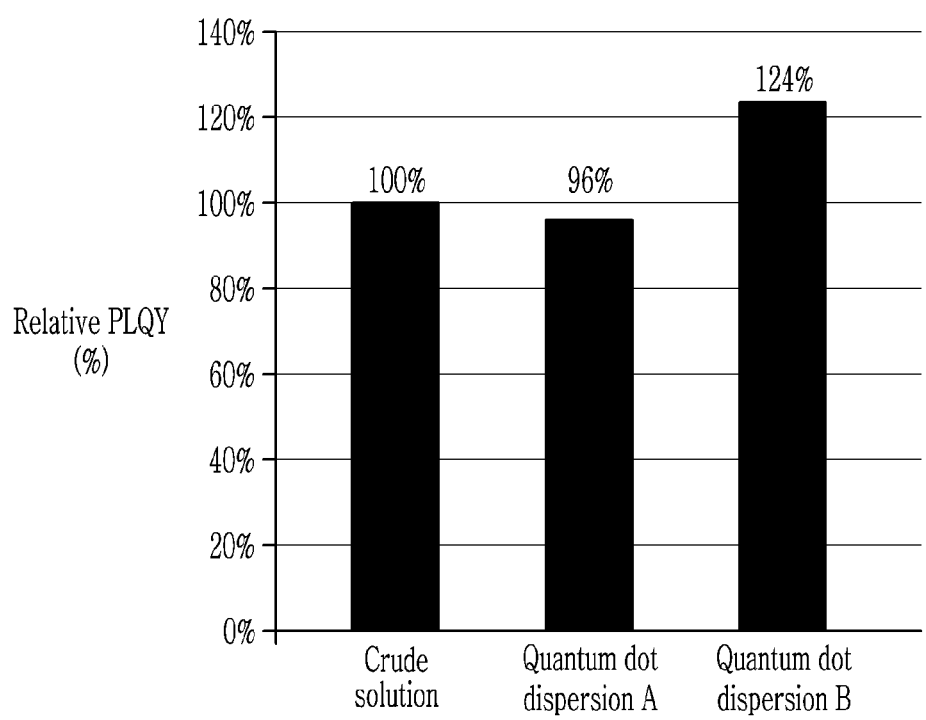
FIG. 7 is a view showing the results of Experimental Example 1.

The relative ratios of the photoluminescence (PL) quantum yield (PLQY) of each of quantum dot dispersion A (containing the OA RQD) and quantum dot dispersion B (containing the ZA-DDT RQD) are measured with respect to the PLQY of the quantum dot chloroform dispersion of Reference Example 1 (the crude solution), respectively. The results are shown in FIG. 7. The results of FIG. 7 confirm that quantum dot dispersion B including the surface exchanged quantum dot may have a quantum yield increased by 24% and 28% in comparison with the crude solution and quantum dot dispersion A, respectively.

Experimental Example 2: Dispersion Stability in Cyclohexane II

Figure 8:
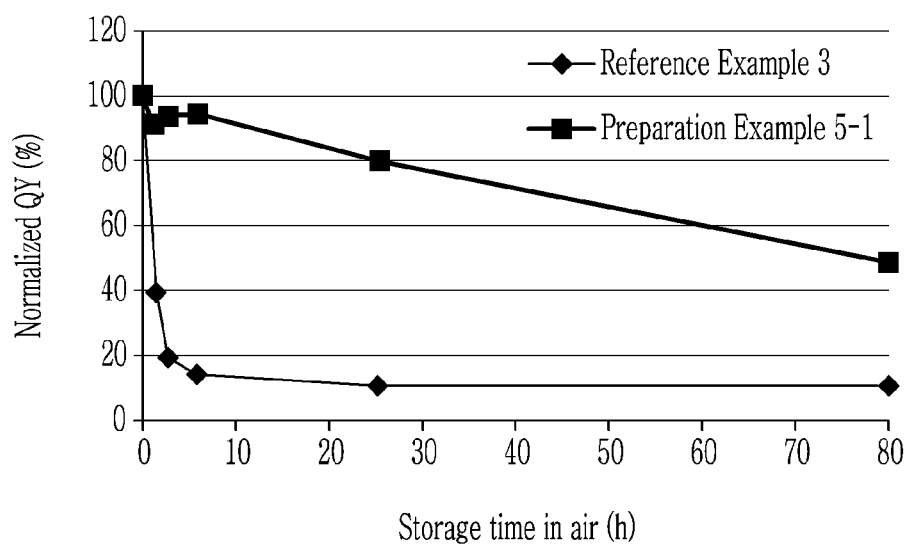
FIG. 8 is a view showing the results of Experimental Example 2.

Each of the quantum dots of Reference Example 3 and the surface exchanged blue-light emitting quantum dots obtained in Preparation Example 5-1 (i.e., ZnCl-DDT BQD-1) is separated and dispersed in cyclohexane, respectively, to obtain a quantum dot dispersion. The prepared quantum dot dispersion is left in air at room temperature and the changes of the quantum yield of the dispersion are observed. The results are shown in FIG. 8. The results of FIG. 8 confirmed that the surface exchanged quantum dot of Preparation Example 5-1 may have improved stability.

Experimental Example 3: XPS Analysis

An XPS analysis is made for the quantum dot of Reference Example 3 including the oleic acid as a surface ligand, the quantum dot of Preparation Example 4 (surface exchanged with $ZnCl_2$ and the octanethiol), and the quantum dot of Comparative Preparation Example 3 (surface exchanged with the octanethiol), respectively. The results are shown in Table 1.

TABLE 1

|  | S2p | Cl2p | Zn2p3 |
| --- | --- | --- | --- |
| Reference Example 3 | 5.35 | — | 11.85 |
| Comparative Preparation Example 3 | 6.38 | — | 11.03 |
| Preparation Example 4 | 7.97 | 2.9 | 14.94 |

The results of Table 1 confirm that the quantum dot surface exchanged with the zinc chloride and the octanethiol has an increased ratio of the zinc, the sulfur, and the chlorine.

Experimental Example 4: TGA Analysis

An TGA analysis is made for the quantum dot of Reference Example 3 including the oleic acid as a surface ligand and the quantum dot of Preparation Example 5-1 (surface-exchanged with $ZnCl_2$ and the dodecanethiol), respectively. The results are shown in FIG. 9 and FIG. 10.

Figure 9:
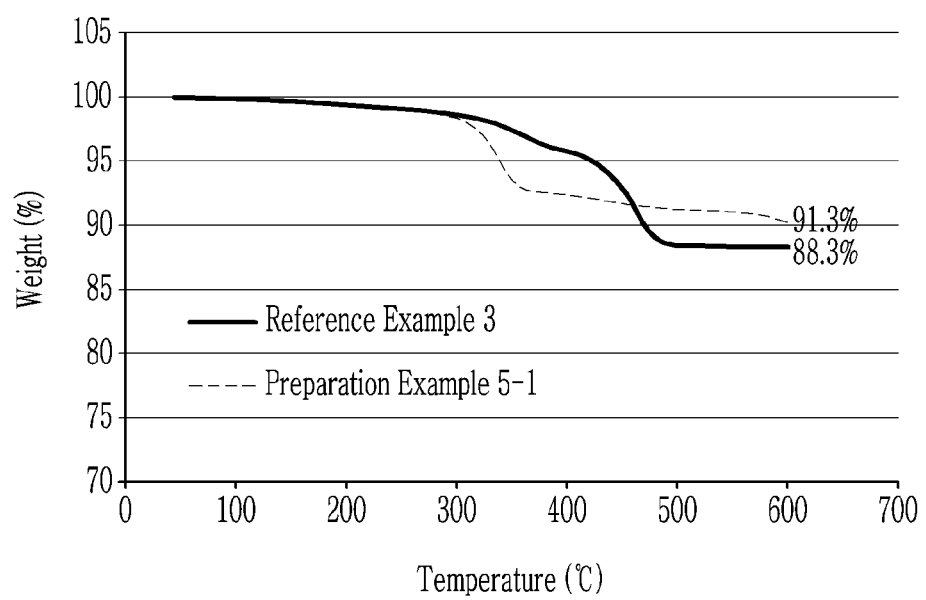
FIG. 9 is a view showing the results of a thermal gravimetric analysis made in Experimental Example 4.
Figure 10:
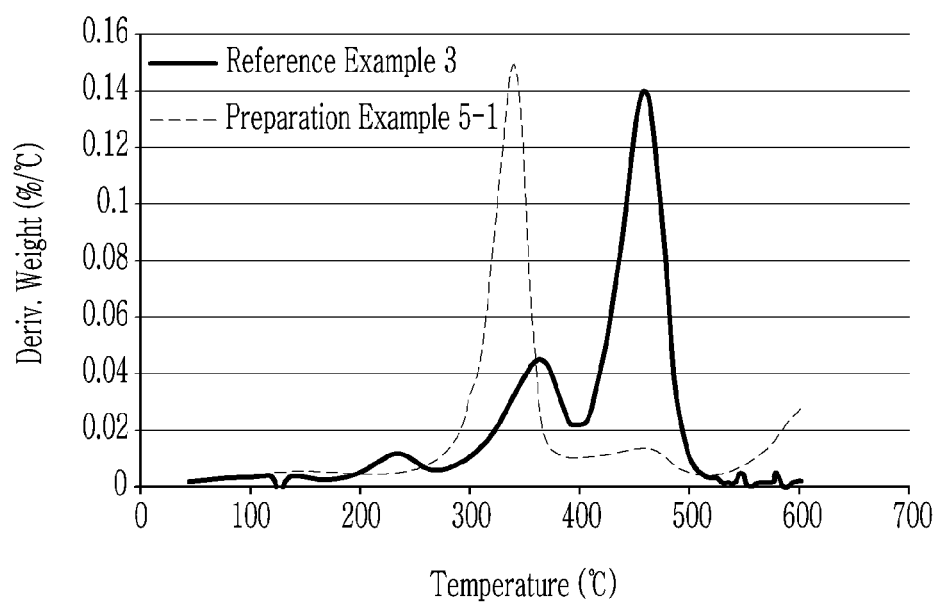
FIG. 10 is a view showing the results of a thermal gravimetric analysis made in Experimental Example 4.

The results of FIG. 9 and FIG. 10 confirm that when the surface ligand oleic acid is replaced with the zinc chloride and the dodecanethiol, the amount of the organic substance included in the quantum dot may substantially change. In the thermogravimetric curve of the quantum dot of Preparation Example 5-1, the intensity of the peak attributed to the decomposition of the oleic acid at a temperature of greater than or equal to about 400° C. is significantly decreased while the intensity of the peak attributed to the decomposition of the dodecanethiol at a temperature of about 300° C. to 400° C. is sharply increased. In addition, the results may imply that the amount of the oleic acid included in the quantum dot of Preparation Example 5-1 is less than or equal to about 1 wt % based on the total weight of the quantum dot.

Preparation of Light Emitting Device

Comparative Example 1

A light emitting device is fabricated by using the quantum dot of Reference Example 1 including the oleic acid as a surface ligand (hereinafter, the OA-RQD). The ITO electrode (cathode) is vapor deposited on a substrate and a ZnO layer is formed as an electron transport layer thereon. The quantum dot solution obtained in Reference Example 1 is spin-coated thereon to form an emissive layer having a thickness of about 15 nm.

A TFB layer and a PEDOT:PSS layer are spin-coated on the emissive layer as a hole transport layer and a hole injection layer, respectively, and a silver (Ag) electrode is vapor-deposited on the PEDOT:PSS layer to obtain a light emitting device.

Comparative Example 2

A light emitting device is fabricated in the same manner as set forth in Comparative Example 1 except for using the surface exchanged quantum dot (DDT RQD) prepared in Comparative Preparation Example 1 instead of the OA-RQD.

Example 1

A light emitting device is fabricated in the same manner as set forth in Comparative Example 1 except for using the surface exchanged quantum dot (ZA-DDT RQD) prepared in Preparation Example 1 instead of the OA-RQD.

Comparative Example 3: ITO/PEDOT:PSS/TFB/QD Layer/ET204:Liq; Liq/Al

A light emitting device is fabricated by using the quantum dot of Reference Example 3 (i.e., the OA-BQD). The ITO electrode (anode) is vapor deposited on a substrate and a PEDOT:PSS layer and a TFB layer are formed in this order as a hole injection layer and a hole transport layer on the ITO electrode, respectively. On the TFB layer, the quantum dot solution including the quantum dot of Reference Example 3 (i.e., the OA-BQD) is spin-coated to form an emissive layer having a thickness of about 15 nm.

On the emissive layer, a ET204 (i.e., 8-(4-(4,6-di(naphthalen-2-yl)-1,3,5-triazin-2-yl)phenyl)quinolone): lithium-8-hydroxy-quinolinolate (Liq) layer and a Liq layer are formed in this order as an electron transport layer, respectively, via vapor deposition and a silver (Ag) electrode (cathode) is vapor-deposited on the electron transport layer to obtain a light emitting device.

Example 2

A light emitting device is fabricated in the same manner as set forth in Comparative Example 3 except for using the surface exchanged quantum dot (ZnCl-DDT BQD-1) prepared in Preparation Example 5-1 instead of the OA-BQD.

Example 3

A light emitting device is fabricated in the same manner as set forth in Comparative Example 3 except for using the surface exchanged quantum dot (ZnCl-DDT BQD-2) prepared in Preparation Example 5-2 instead of the OA-BQD.

Example 4

A light emitting device is fabricated in the same manner as set forth in Comparative Example 3 except for using the surface exchanged quantum dot (ZnCl-OT BQD) prepared in Preparation Example 4 instead of the OA-BQD.

Example 5

A light emitting device is fabricated in the same manner as set forth in Comparative Example 3 except for using the surface exchanged quantum dot (ZA-DDT BQD) prepared in Preparation Example 1 instead of the OA-BQD.

Comparative Example 4

A light emitting device is fabricated in the same manner as set forth in Comparative Example 3 except for using the surface exchanged quantum dot (DDT BQD) prepared in Comparative Preparation Example 2 instead of the OA-BQD.

Reference Example 4: Fabrication of Hole Only Device (HOD)

A hole only device (HOD) (ITO/PEDOT:PSS/QD emissive layer/PEDOT:PSS/Al) is fabricated in the following manner. An ITO patterned substrate is subject to a ultraviolet-ozone (UVO) surface treatment and a PEDOT:PSS layer (a hole transport layer) is spin-coated thereon to have a thickness of about 40 nm and then heat-treated to remove a remaining organic matter. A quantum dot dispersion is spin-coated thereon to form an emissive layer with a thickness of about 35 to 40 nm, which is then heat-treated to remove a remaining organic matter. On the emissive layer, another PEDOT:PSS layer is formed via a spin-coating method to have a thickness of about 40 nm as a hole transport layer then heat-treated to remove a remaining organic matter. Under a mask, aluminum (Al) is thermal-deposited on the hole transport layer to form an electrode. Using an encapsulating resin/glass, the resulting structure is encapsulated.

Reference Example 5: Fabrication of Electron Only Device (EOD)

An electron only device (EOD) (ITO/ZnO/QD emissive layer/ET204:Liq/Al) is fabricated in the following manner. An ITO patterned substrate is subject to a UVO surface treatment and a ZnO layer (an electron transport layer) is formed to have a thickness of about 40 nm via spin-coating. A quantum dot dispersion is spin-coated thereon to form an emissive layer with a thickness of about 35 to 40 nm, which is then heat-treated to remove a remaining organic matter. On the emissive layer, a ET204:Liq layer is formed via vapor deposition to have a thickness of about 40 nm as an electron transport layer. Under a mask, an aluminum (Al) is thermal-deposited on the ET204:Liq layer to form an electrode. Using an encapsulating resin/glass, the resulting structure is encapsulated.

Evaluation of the Properties of the Light Emitting Device

Experimental Example 5

A voltage of 0 to 7 volts (V) is applied to each of the light emitting devices of Comparative Example 1, Comparative Example 2, and Example 1 to measure the electroluminescent properties (i.e., the current efficiency and the current-voltage characteristics) of the device. The results are shown in FIG. 11 and FIG. 12.

Figure 11:
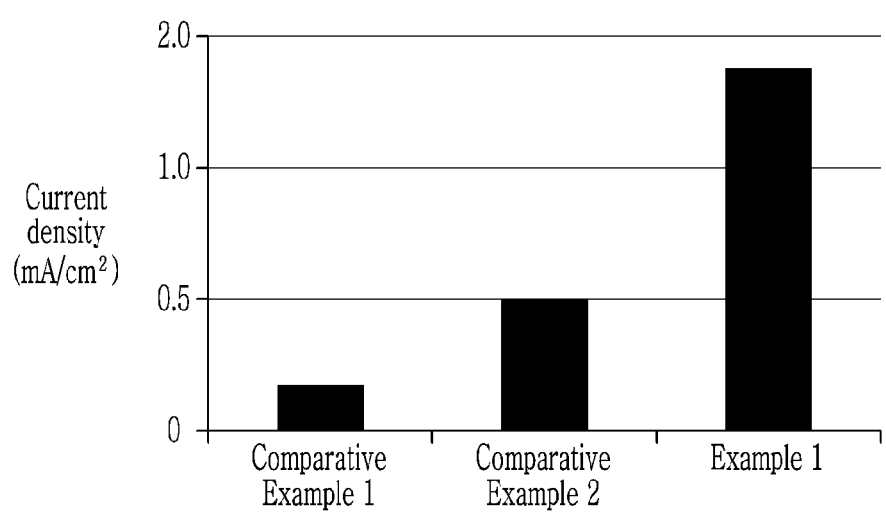
FIG. 11 and FIG. 12 are views showing the results of Experimental Example 5.
Figure 12:
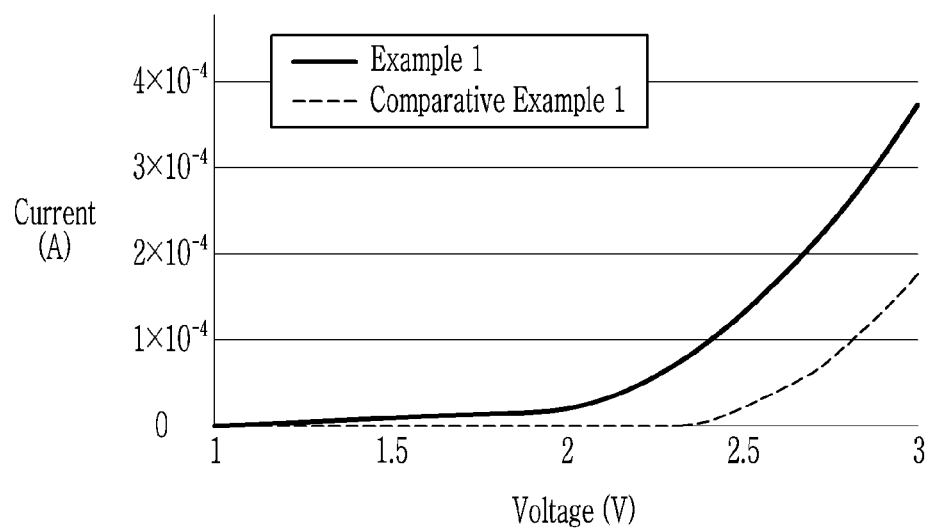

The results of FIG. 11 confirm that the light emitting device of Example 1 may have significantly improved current density in comparison with the devices of Comparative Examples 1 and 2. The results of FIG. 12 confirm that the light emitting device of Example 1 may have a turn on voltage that is significantly lower than that of the device of Comparative Example 1.

Experimental Example 6

A voltage of 0 to 7 V is applied to each of the light emitting device of Comparative Example 3 and Example 3 to measure the electroluminescent properties (i.e., max EQE, EQE at 100 nit, voltage V (at 5 milliamps (mA)), and Maximum brightness) of the device. The results are shown in Table 2.

TABLE 2

| Device # | solution PL QY | EQE (Max.) | EQE (100 nit) | voltage V (at 5 mA) | Max. Brightness |
|---|---|---|---|---|---|
| Comparative Example 3 | 60% | 1.1% | 0.8% | 4.8 | ≈1000 nits |
| Example 3 | 90% | 6.0% | 6.0% | 3.7 | ≈2000 nits | nit: candela per square meter (Cd/m$^2$)

The results of Table 2 confirm that the device of Example 3 may have significantly improved electroluminescent properties in comparison with the device of Comparative Example 3 that includes the quantum dots without being surface-exchanged.

Experimental Example 7

Figure 13:
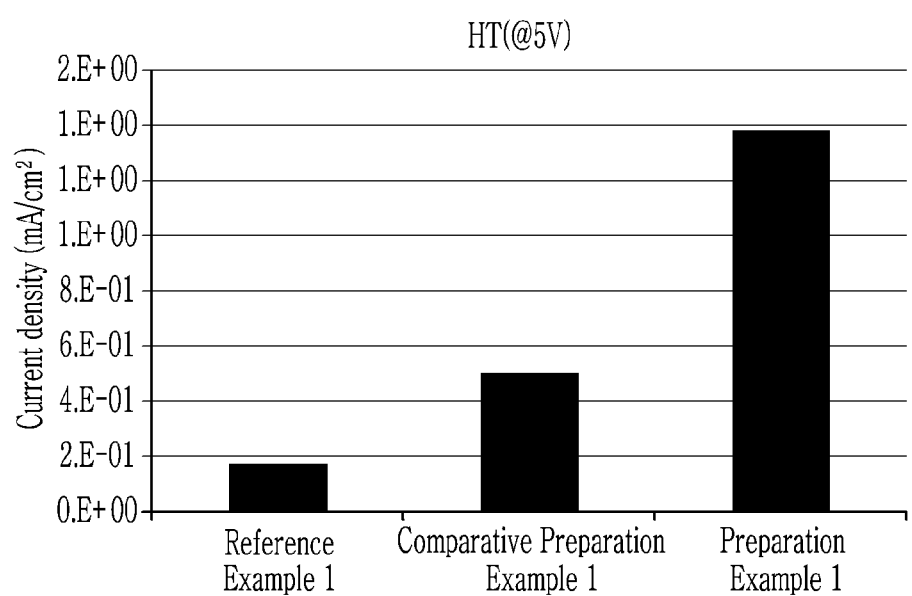
FIG. 13 is a view showing the summary of the results of Experimental Example 7.

Three hole only devices (HODs) are fabricated in the same manner as set forth in Reference Example 4 by using the quantum dots of Reference Example 1 (InP/ZnSeS RQD), the quantum dots of Comparative Preparation Example 1 (DDT-RQD), and the quantum dots of Preparation Example 1 (ZA-DDT RQD), respectively. For each of the HODs, a current density is measured while a voltage of 5V is applied thereto and the results are shown in FIG. 13. The results of FIG. 13 confirm that the quantum dots of Preparation Example 1 may have a significantly improved hole transport (HT) property.

Experimental Example 8

Figure 14:
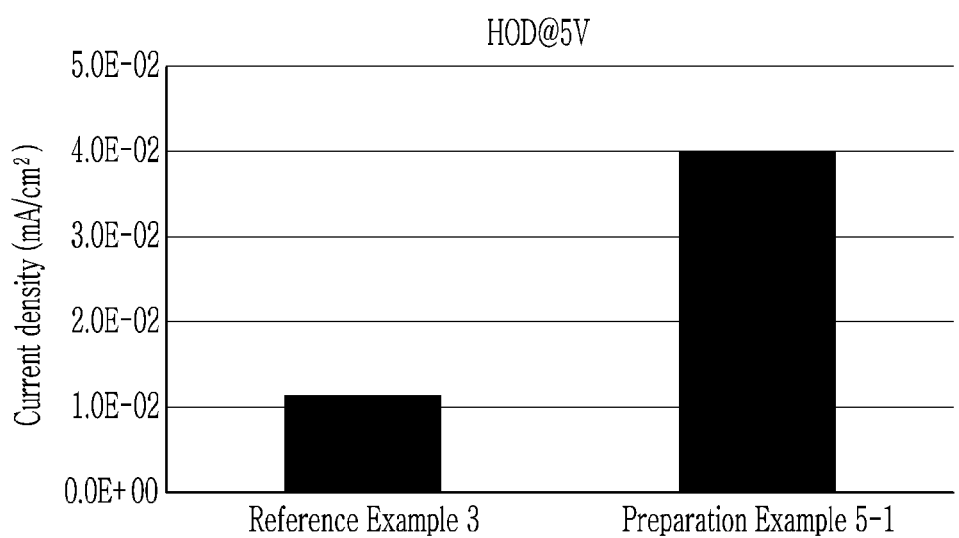
FIG. 14 and FIG. 15 are views showing the summary of the results of Experimental Example 8.

[1] Two hole only devices (HODs) are fabricated in the same manner as set forth in Reference Example 4 by using the quantum dots of Reference Example 3 (ZnSe/ZnSeS BQD) and the quantum dots of Preparation Example 5-1 (ZnCl-DDT BQD-1), respectively. For each of the HODs, a current density is measured while a voltage of 5V is applied thereto and the results are shown in FIG. 14. The results of FIG. 14 confirm that the surface exchanged quantum dots of Preparation Example 5-1 may have a significantly improved hole transport (HT) property.

Figure 15:
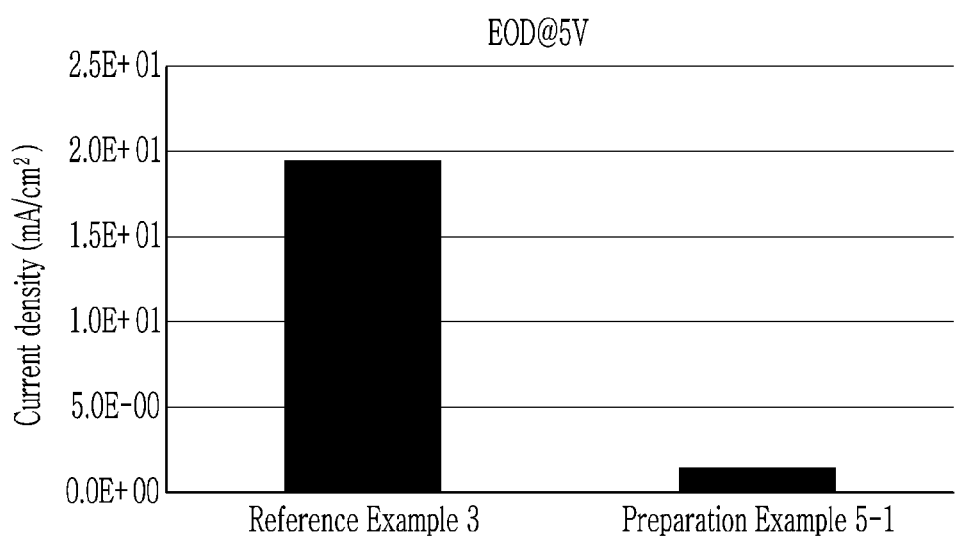

[2] Two electron only devices (EODs) are fabricated in the same manner as set forth in Reference Example 5 by using the quantum dots of Reference Example 3 (ZnSe/ZnSeS BQD) and the quantum dots of Preparation Example 5-1 (ZnCl-DDT BQD-1), respectively. For each of the EODs, a current density is measured while a voltage of 5V is applied thereto and the results are shown in FIG. 15. The results of FIG. 15 confirm that the surface exchanged quantum dots of Preparation Example 5-1 may have a significantly improved electron transport (ET) property.

[3] The results of the foregoing HT and ET properties indicate that the surface exchanged quantum dots of Preparation Example 5-1 may contribute to the improvement on the hole-electron balance in an electroluminescent device.

Experimental Example 9

Figure 16:
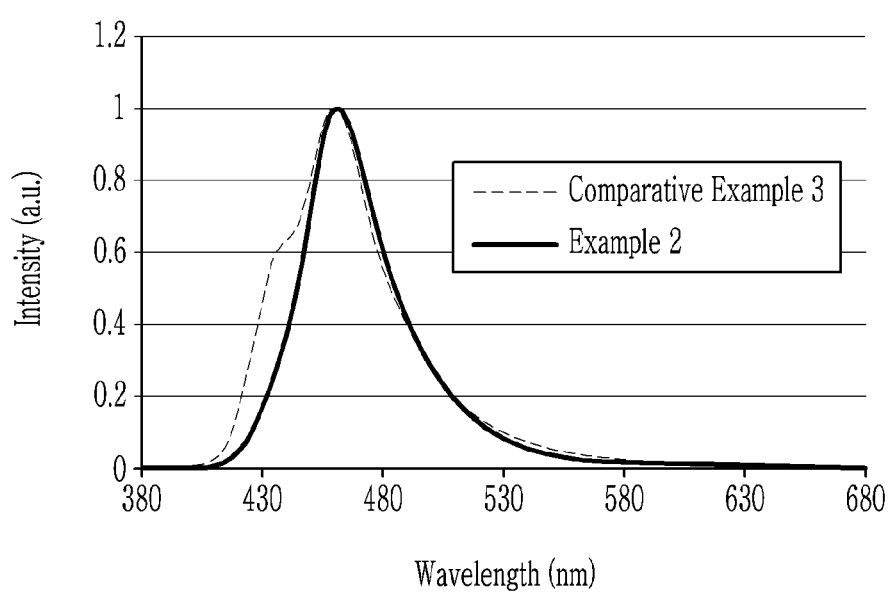
FIG. 16 is a view showing the summary of the results of Experimental Example 9.

Each of the devices of Comparative Example 3 and Example 2 is operated at a predetermined current density to obtain an electroluminescent spectrum. The device of Comparative Example 3 includes the ZnSe/ZnSeS BQD of Reference Example 3 having the oleic acid as a surface ligand while the device of Example 2 includes the surface exchanged quantum dots of Reference Example 5-1 (ZnCl-DDT BQD-1). The results are shown in FIG. 16. The results of FIG. 16 confirm that the device of Comparative Example 3 shows an electroluminance due to the electron-hole recombination occurring at the interface between the hole transport layer (TFB) and the quantum dot while the device of Example 2 does not include an electroluminance due to the electron-hole recombination occurring at the interface. Without wishing to be bound by any theory, in the case of the device of Example 2, the ligand exchange moves the position of the recombination between the electron and the hole into the quantum dot, and thereby only the light emission due to the quantum dot occurs.

Experimental Example 10: Lifetime Evaluation of the Device

Lifetime evaluation is made for the devices of Comparative Example 3 and Example 2 in the following manner.

The device is placed in a jig under a dark environment and a constant current that may achieve an initial brightness of 100 nits is applied to the device that are further equipped with a photo-diode and a IV tester. Using the photodiode and the IV tester, the changes in the brightness (i.e., the photocurrent) and the voltage of the device are observed over the time and the results are shown in FIG. 17 and FIG. 18, respectively.

Figure 17:
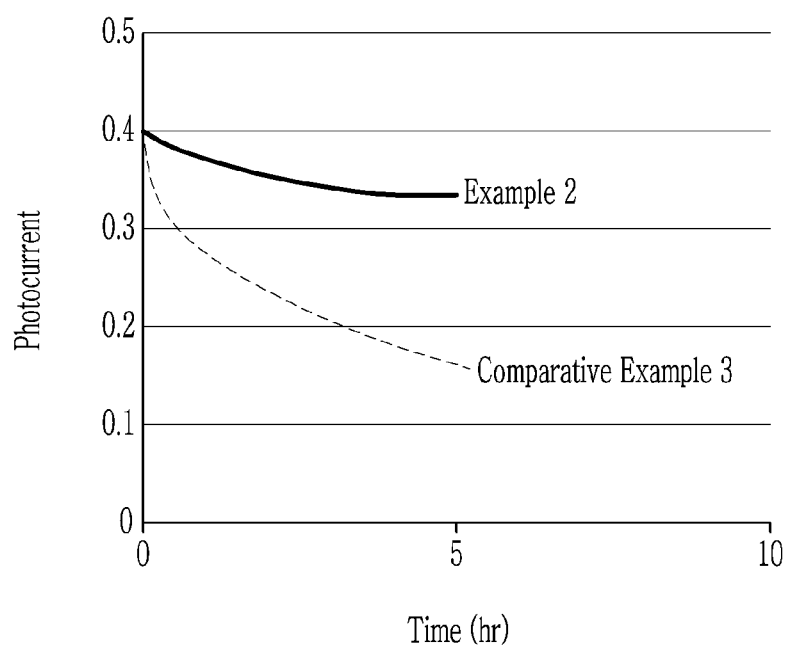
FIG. 17 and FIG. 18 are views showing the summary of the results of Experimental Example 10.
Figure 18:
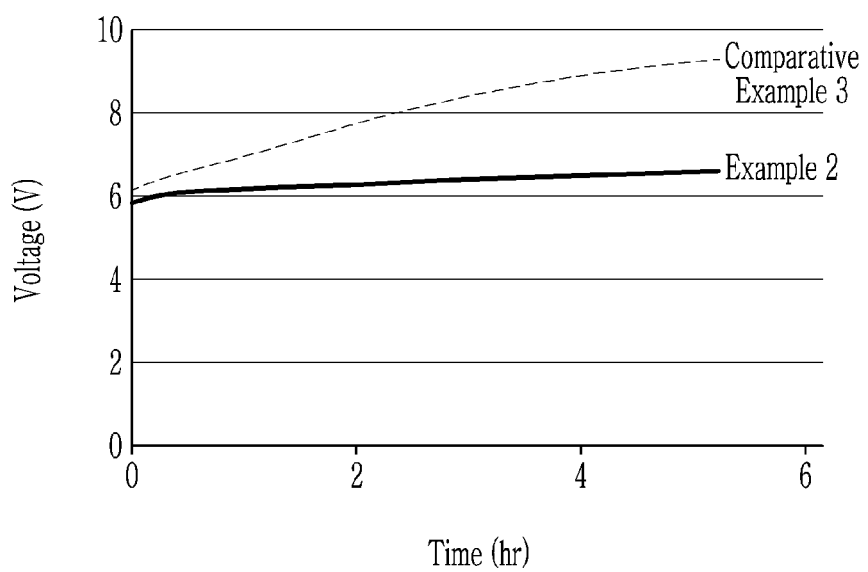

The results of FIG. 17 and FIG. 18 confirm that the device of Example 2 shows a higher stability than the device of Comparative Example 3.

Experimental Example 11: Determination of HOMO Level

[1] For the quantum dots of Preparation Example 4 (ZnCl-OT BQD) and Comparative Preparation Example 3 (OT-BQD), the HOMO level of the quantum dots are measured by using an atmospheric pressure photoelectron spectrometer AC3 (manufactured by Riken Keiki Co., Ltd.). The results confirm that the HOMO level of the quantum dots of Preparation Example 4 (ZnCl-OT BQD) has a HOMO level of about 5.7 electronvolts (eV) while the HOMO level of the quantum dots of Comparative Preparation Example 3 (OT-BQD) has a HOMO level of about 5.3 eV. Without wishing to be bound by any theory, the quantum dots included in the device of the Example have a controlled HOMO level and thereby may show an improved injection efficiency, which may cause improved electroluminescent properties of the device.

[2] For the quantum dots of Preparation Example 5-1 (ZnCl-DDT BQD-1) and Reference Example 3 (Zn(Te)Se/ZnSeS BQD with the oleic acid), the HOMO level of the quantum dots are measured by using an atmospheric pressure photoelectron spectrometer AC3 (manufactured by Riken Keiki Co., Ltd.). The results confirm that the HOMO level of the quantum dots of Preparation Example 5-1 (ZnCl-DDT BQD-1) is about 5.9 eV while the HOMO level of the quantum dots of Reference Example 3 (OA-BQD) is about 5.4 eV.

Experimental Example 12: Evaluation of the Electroluminescence (EL) Properties of the Devices A voltage of 0 to 7 V is applied to each of the light emitting device of Comparative Example 4, Example 2, and Example 4 to measure the electroluminescent properties (i.e., max EQE, EQE at 100 nit, voltage V (at 5 mA), and Maximum brightness) of the device. With respect to those of the EL properties of the devices of Comparative Example 4, the relative ratios of the EL properties of the devices of Examples 2 and 4 are calculated and compiled in Table 3.

TABLE 3

| Device # | Surface Ligand | Relative ratio of Maximum EQE | Relative ratio of voltage (V) @ 5 milliamps (mA) | Relative ratio of brightness @ 5 mA |
| --- | --- | --- | --- | --- |
| Comp. Example 4 | DDT only | 100% | 100% | 100% |
| Example 2 | ZnCl2 + DDT One time of surface exchange | 254% | 78% | 462% |
| Example 5 | ZA + DDT | 95% | 80% | 168% |

The results of Table 3 confirm that the devices of Examples 2 and 5 may have significantly improved electroluminescent properties in comparison with the device of Comparative Example 4 that includes the quantum dots surface-exchanged only with the DDT.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A light emitting device comprising:
   a first electrode and a second electrode facing each other, and
   a light emitting layer disposed between the first electrode and the second electrode and comprising a quantum dot,
   wherein the quantum dot comprises
      a semiconductor nanocrystal, and
      a ligand and a polyvalent metal compound, the ligand and polyvalent metal compound each bound to a surface of the semiconductor nanocrystal,
   wherein the ligand comprises an organic thiol ligand or a salt thereof,
   wherein the quantum dot comprises a core comprising a first semiconductor nanocrystal and a shell disposed on the core and comprising a second semiconductor nanocrystal,
   wherein the polyvalent metal compound comprises a compound represented by Chemical Formula 2 or aluminum chloride:

Chemical Formula 2
   $MA_n$ wherein M is Mg, Ca, Sc, Ti, V, Cr, Mn, Fe, Co, Ni, Cu, Zn, Ga, Sr, Y, Zr, Nb, Mo, Cd, In, Ba, Au, Hg, or Tl, n is determined depending on the valency of the M and is an integer of greater than or equal to 2, each A is the same or different, and is independently a C1-C10 organic group, a halogen, or a combination thereof, and
   wherein the compound represented by Chemical Formula 2 comprises a metal halide, a metal acrylate, a metal methacrylate, a metal dialkyldithiocarbamate, or a combination thereof.

2. A light emitting device of claim 1, wherein
   the first semiconductor nanocrystal comprises InP, InZnP, ZnSe, ZnTeSe, or a combination thereof and the second semiconductor nanocrystal comprises ZnS; or the first semiconductor nanocrystal and the second semiconductor nanocrystal are the same or different, and are independently a Group II-VI compound, a Group III-V compound, a Group IV-VI compound, a Group IV element or compound, a Group compound, a Group I-II-IV-VI compound, or a combination thereof.

3. A light emitting device of claim 1, wherein the organic thiol ligand or a salt thereof comprises a compound represented by Chemical Formula 1:

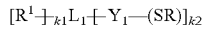

Chemical Formula 1 wherein,
$R^1$ is hydrogen, a substituted or unsubstituted C1 to C40 linear or branched alkyl group, a C1 to C40 linear or branched alkenyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C3 to C30 cycloalkyl group, a substituted or unsubstituted C2 to C30 heterocycloalkyl group, a C1 to C10 alkoxy group, a hydroxy group, —NH2, a substituted or unsubstituted C1 to C30 amine group, an isocyanate group, a halogen, —$R^aOR^{a'}$, wherein $R^a$ is a substituted or unsubstituted C1 to C20 alkylene group and $R^{a'}$ is hydrogen or a C1 to C20 linear or branched alkyl group, an acyl halide, —C(=O)$OR^{b'}$, wherein $R^{b'}$ is hydrogen or a C1 to C20 linear or branched alkyl group, —CN, —C(=O)$NR^cR^{c'}$, wherein RC and RC' are the same or different, and are independently hydrogen or a C1 to C20 linear or branched alkyl group, —C(=O)$ONR^dR^{d'}$, wherein $R^d$ and $R^{d'}$ are the same or different, and are independently hydrogen or a C1 to C20 linear or branched alkyl group, or a combination thereof,
$L_1$ is a carbon atom, a nitrogen atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C2 to C30 heterocycloalkylene group, a substituted or unsubstituted C6 to C30 arylene group, a substituted or unsubstituted C3 to C30 heteroarylene group, or a substituted or unsubstituted C2 to C30 alkylene group or a substituted or unsubstituted C3 to C30 alkenylene group wherein at least one methylene is replaced with sulfonyl, carbonyl, ether, sulfide, sulfoxide, ester, amide, or a combination thereof,
Y1 is a single bond, —C(=S)—, a substituted or unsubstituted C1 to C30 alkylene group, a substituted or unsubstituted C2 to C30 alkenylene group, or a C2 to C30 alkylene group or a C3 to C30 alkenylene group wherein at least one methylene is replaced by sulfonyl, carbonyl, ether, sulfide, sulfoxide, ester, amide, imine, or a combination thereof,
R is hydrogen or a monovalent metal;
k1 is 0 or an integer of 1 or more,
k2 is 1 or 2 wherein when the k2 is 2, the $Y_1$ is a single bond and the two SR moieties are bonded to adjacent two carbon atoms in the L1 moiety, respectively, provided that a sum of k1 and k2 does not exceed the valence of $L_1$.

4. A light emitting device of claim 1, wherein the organic thiol ligand or a salt thereof comprises a compound represented by Chemical Formula 1-1, Chemical Formula 1-2, or Chemical Formula 1-3:

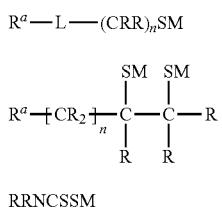

Chemical Formula 1-1
$R^a$—L—(CRR)$_n$SM

Chemical Formula 1-2

Chemical Formula 1-3
RRNCSSM wherein $R^a$ is a substituted or unsubstituted C1 to C24 alkyl group, a substituted or unsubstituted C2 to C24 alkenyl group, or a substituted or unsubstituted C6 to C20 aryl group, each R is the same or different, and is independently hydrogen or a substituted or unsubstituted C1 to C24 alkyl group, n is 0 or an integer of 1 to 15, L is a direct bond, a sulfonyl, carbonyl, ether group, sulfide group, sulfoxide group, ester group, amide group, a substituted or a unsubstituted C1 to C10 alkylene, a C2 to C10 alkenylene, or a combination thereof, and M is hydrogen, lithium, sodium, potassium, or a combination thereof.

5. A light emitting device of claim 1, wherein the organic thiol ligand or a salt thereof comprises butanethiol, pentanethiol, hexanethiol, heptanethiol, octanethiol, nonanethiol, decanethiol, undecanethiol, dodecanethiol, octadecanethiol, 2-(2-methoxyethoxy)ethanethiol, 3-methoxybutyl 3-mercaptopropionate, 3-methoxybutyl mercaptoacetate, thioglycolic acid, 3-mercaptopropionic acid, thiopronine, 2-mercaptopropionic acid, 2-mercapto propionate, 2-mercaptoethanol, cysteamine, 1-thioglycerol, mercaptosuccinic acid, L-cysteine, dihydrolipoic acid, 2-(dimethyl amino)ethanethiol, 5-mercaptomethyl tetrazole, 2,3-dimercapto-1-propanol glutathione, methoxy polyethylene glycol thiol, di(C1 to C30 alkyl)dithiocarbamic acid or a salt thereof, or a combination thereof.

6. A light emitting device of claim 1, wherein the polyvalent metal compound comprises indium, zinc, aluminum, manganese, or a combination thereof.

7. A light emitting device of claim 1, wherein the compound represented by Chemical Formula 2 comprises a metal halide.

8. A light emitting device of claim 1, wherein the polyvalent metal compound comprises zinc chloride, indium chloride, cadmium chloride, aluminum chloride, manganese chloride, a zinc (meth)acrylate compound, an indium acetate, or a combination thereof.

9. A light emitting device of claim 1, wherein the polyvalent metal compound is present in an amount of about 10 percent by weight to about 90 percent by weight based on a total amount of the organic thiol ligand or a salt thereof and the polyvalent metal compound.

10. A light emitting device of claim 1, wherein the organic thiol ligand or a salt thereof does not comprise a carboxylic acid moiety.

11. A light emitting device of claim 1 comprising:
a first electrode and a second electrode facing each other, and
a light emitting layer disposed between the first electrode and the second electrode and comprising a quantum dot,
wherein the quantum dot comprises
a semiconductor nanocrystal, and
a ligand and a polyvalent metal compound, the ligand and polyvalent metal compound each bound to a surface of the semiconductor nanocrystal,
wherein the ligand comprises an organic thiol ligand or a salt thereof,
wherein the quantum dot comprises a core comprising a first semiconductor nanocrystal and a shell disposed on the core and comprising a second semiconductor nanocrystal,
wherein the polyvalent metal compound comprises a compound represented by Chemical Formula 2 or aluminum chloride:

Chemical Formula 2
MA$_n$ wherein M is Mg, Ca, Sc, Ti, V, Cr, Mn, Fe, Co, Ni, Cu, Zn, Ga, Sr, Y, Zr, Nb, Mo, Cd, In, Ba, Au, Hg, or Tl, n is determined depending on the valency of the M and is an integer of greater than or equal to 2, each A is the same or different, and is independently a C1-C10 organic group, a halogen, or a combination thereof, and
wherein the compound represented by Chemical Formula 2 comprises a metal halide, a metal carboxylate, a metal acrylate, a metal methacrylate, a metal dialkyldithiocarbamate, or a combination thereof, and, wherein in the quantum dot, an amount of a monocarboxylic acid compound having a carbon number of at least 10 is less than 5 percent by weight based on a total weight of the quantum dot.

12. A light emitting device of claim 1, wherein the light emitting device further comprises
a hole auxiliary layer comprising a hole injection layer, a hole transport layer, an electron blocking layer, or a combination thereof between the first electrode and the light emitting layer; or
an electron auxiliary layer comprising an electron injection layer, an electron transport layer, a hole blocking layer, or a combination thereof between the second electrode and the light emitting layer.

13. A display device comprising a light emitting device of claim 1.

14. A light emitting device of claim 1, wherein the polyvalent metal compound comprises a metal (meth)acrylate, a metal halide, a metal dialkyldithiocarbamate, or a combination thereof.

15. A light emitting device of claim 1, wherein the polyvalent metal compound comprises indium chloride, cadmium chloride, aluminum chloride, manganese chloride, an indium acetate, or a combination thereof.

16. A light emitting device of claim 1, wherein the polyvalent metal compound comprises zinc chloride.

17. A light emitting device of claim 1, wherein the polyvalent metal compound comprises a zinc halide.

18. A light emitting device of claim 1, wherein the polyvalent metal compound comprises a zinc (meth)acrylate compound.

19. A light emitting device comprising:
a first electrode and a second electrode facing each other, and
a light emitting layer disposed between the first electrode and the second electrode and comprising a quantum dot,
wherein the quantum dot comprises
a semiconductor nanocrystal, and
a ligand and a polyvalent metal compound, the ligand and polyvalent metal compound each bound to a surface of the semiconductor nanocrystal, wherein the ligand comprises an organic thiol ligand or a salt thereof, wherein the quantum dot comprises a core comprising a first semiconductor nanocrystal and a shell disposed on the core and comprising a second semiconductor nanocrystal, wherein the polyvalent metal compound comprises a compound represented by Chemical Formula 2 or aluminum chloride:

Chemical Formula 2

$MA_n$ wherein M is Mg, Ca, Sc, Ti, V, Cr, Mn, Fe, Co, Ni, Cu, Ga, Sr, Y, Zr, Nb, Mo, Cd, In, Ba, Au, Hg, or Tl, n is determined depending on the valency of the M and is an integer of greater than or equal to 2, each A is the same or different, and is independently a C1-C10 organic group, a halogen, or a combination thereof, and wherein the compound represented by Chemical Formula 2 comprises a metal halide, a metal carboxylate, a metal acrylate, a metal methacrylate, a metal dialkyldithiocarbamate, or a combination thereof.

20. A light emitting device comprising:

a first electrode and a second electrode facing each other, and a light emitting layer disposed between the first electrode and the second electrode and comprising a quantum dot, wherein the quantum dot comprises
a semiconductor nanocrystal, and
a ligand and a polyvalent metal compound, the ligand and polyvalent metal compound each bound to a surface of the semiconductor nanocrystal, wherein the ligand comprises an organic thiol ligand or a salt thereof, wherein the quantum dot comprises a core comprising a first semiconductor nanocrystal and a shell disposed on the core and comprising a second semiconductor nanocrystal, wherein the polyvalent metal compound comprises a compound represented by Chemical Formula 2 or aluminum chloride:

Chemical Formula 2

$MA_n$ wherein M is Mg, Ca, Sc, Ti, V, Cr, Mn, Fe, Co, Ni, Cu, Zn, Ga, Sr, Y, Zr, Nb, Mo, Cd, In, Ba, Au, Hg, or Tl, n is determined depending on the valency of the M and is an integer of greater than or equal to 2, each A is the same or different, and is independently a C1-C10 organic group, a halogen, or a combination thereof, wherein the compound represented by Chemical Formula 2 comprises a metal halide, a metal carboxylate, a metal acrylate, a metal methacrylate, a metal dialkyldithiocarbamate, or a combination thereof, and wherein the compound represented by Chemical Formula 2 does not comprise a zinc carboxylate.

* * * * *